(12) United States Patent
Boonekamp et al.

(10) Patent No.: US 9,310,540 B2
(45) Date of Patent: Apr. 12, 2016

(54) LIGHT COLLECTOR DEVICE

(71) Applicant: KONINKLIJKE PHILIPS N.V., Eindhoven (NL)

(72) Inventors: Erik Paul Boonekamp, Eindhoven (NL); Rick Gerhardus Nijkamp, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 14/399,008

(22) PCT Filed: May 6, 2013

(86) PCT No.: PCT/IB2013/053601
§ 371 (c)(1),
(2) Date: Nov. 5, 2014

(87) PCT Pub. No.: WO2013/168069
PCT Pub. Date: Nov. 14, 2013

(65) Prior Publication Data
US 2015/0083221 A1    Mar. 26, 2015

Related U.S. Application Data

(60) Provisional application No. 61/643,544, filed on May 7, 2012.

(30) Foreign Application Priority Data

May 7, 2012    (EP) ...................................... 12166956

(51) Int. Cl.
*H01L 31/055*    (2014.01)
*G02B 5/22*    (2006.01)
(Continued)

(52) U.S. Cl.
CPC ................ *G02B 5/223* (2013.01); *A01G 7/045* (2013.01); *A01G 9/14* (2013.01); *A01G 9/243* (2013.01);
(Continued)

(58) Field of Classification Search
CPC ...... H01L 31/055; G02B 5/223; A01G 7/045; F24J 2/067; F21V 9/16; Y02E 10/40
USPC .............................. 136/259; 362/84; 357/359
See application file for complete search history.

(56) References Cited

U.S. PATENT DOCUMENTS 3,012,477 A    12/1961 Oliver
4,088,116 A *    5/1978 Pastor ........................... 126/677
(Continued)

FOREIGN PATENT DOCUMENTS

JP    51-58965 A    5/1976
JP    2004186334 A    7/2004
(Continued)

*Primary Examiner* — Golam Mowla

(57) ABSTRACT

The invention provides a sheet-like light collector device comprising a light receiving side and a light exit side, and a plurality of curved structures of light guiding material comprising an organic dye configured to absorb at least part of the light of a light source and to convert at least part of the absorbed light into converted light in the visible wavelength range. Each curved structure has a convex curved part at the light receiving side, a concave part at the light exit side, and a light exit edge part at the light exit side. Each curved structure has a curvature and light guide thickness configured to facilitate transport of incoupled light and the visible converted light in the direction of the light exit edge part to provide device light escaping from the light exit edge part.

15 Claims, 15 Drawing Sheets

(51) Int. Cl.
  *F24J 2/06* (2006.01)
  *A01G 7/04* (2006.01)
  *A01G 9/14* (2006.01)
  *A01G 9/24* (2006.01)
  *F21V 9/16* (2006.01)

(52) U.S. Cl.
  CPC . *F21V 9/16* (2013.01); *F24J 2/067* (2013.01); *H01L 31/055* (2013.01); *Y02B 10/20* (2013.01); *Y02E 10/40* (2013.01)

(56) References Cited

U.S. PATENT DOCUMENTS

| | | | | |
|---|---|---|---|---|
| 4,099,516 | A * | 7/1978 | Caulier | 126/667 |
| 4,143,234 | A * | 3/1979 | Johnson et al. | 136/259 |
| 4,148,298 | A * | 4/1979 | Sherman, Jr. | 126/685 |
| 4,227,939 | A * | 10/1980 | Zewail et al. | 136/247 |
| 4,303,729 | A * | 12/1981 | Torobin | 428/327 |
| 4,303,730 | A * | 12/1981 | Torobin | 428/333 |
| 4,303,732 | A * | 12/1981 | Torobin | 428/333 |
| 4,306,542 | A | 12/1981 | Reinert | |
| 4,884,860 | A * | 12/1989 | Brown | 385/27 |
| 2005/0087294 | A1* | 4/2005 | Rabinowitz | 156/304.2 |
| 2006/0191566 | A1* | 8/2006 | Schaafsma | 136/246 |
| 2007/0280622 | A1 | 12/2007 | Rutherford | |
| 2011/0016779 | A1 | 1/2011 | Hermans | |
| 2011/0192446 | A1 | 8/2011 | Kawai | |
| 2012/0000509 | A1* | 1/2012 | Chen | 136/246 |

FOREIGN PATENT DOCUMENTS

| | | |
|---|---|---|
| WO | 2009098617 A1 | 8/2009 |
| WO | 2009115574 A1 | 9/2009 |
| WO | 2010033859 A2 | 3/2010 |
| WO | 2010046358 A1 | 4/2010 |
| WO | 2010052654 A1 | 5/2010 |
| WO | 2012023094 A2 | 2/2012 |
| WO | 2012055729 A1 | 5/2012 |

* cited by examiner

LIGHT COLLECTOR DEVICE

CROSS-REFERENCE TO PRIOR APPLICATIONS

This application is the U.S. National Phase application under 35 U.S.C. §371 of International Application No. PCT/IB2013/053601, filed on May 6, 2013, which claims the benefit of U.S. Provisional Patent Application No. 61/643,544, filed on May 7, 2012 and European Patent Application No. 12166956.8, filed on May 7, 2012. These applications are hereby incorporated by reference herein.

FIELD OF THE INVENTION

The invention relates to a light collector device. The invention further relates to a solar device, a greenhouse or a lighting unit comprising such light collector device.

BACKGROUND OF THE INVENTION

Light incoupling structures are known in the art. WO2009115574, for instance, describes a greenhouse comprising transparent sheets having two main surface sides, containing a luminescent dye within the transparent sheet, characterized in that there is on at least one of the two main surface sides an array of geometrical optical elements. Especially, the photo-luminescent dye is contained within a separate layer which is in contact with the transparent sheet.

Further, luminescent solar concentrators are known in the art. WO2012023094, for instance, describes a photovoltaic device, such as for example a solar concentrator, which uses a scattering or reflecting layer on the rear side of its waveguide. The scattering or reflecting layer also incorporates luminescent or phosphorescent material for absorption and emission. The additional functionality of absorption and emission in the scattering or reflecting layer allows for a more dynamic use of incoming light.

SUMMARY OF THE INVENTION

An important aspect is how light can be directed towards the plants (e.g. in a greenhouse) in an efficient way and with an optimized spectrum. The use of structures like prisms, lenses or scattering micro structures is known in the art. The structures indeed work to extract the light but are not able to direct the light towards the plants effectively enough. In addition, foils provided with (such) microstructures may become too expensive for this application.

Further, a polymeric matrix containing a fluorescent dye and a light scattering (particle) additive might be applied. However, it appears that in some systems more than 50% of the light is direct towards the outside of the greenhouse and is not effectively used by the plant.

Hence, it is an aspect of the invention to provide an alternative light collector device, which preferably further at least partly obviates one or more of above-described drawbacks.

Hence, in a first aspect the invention provides a light collector device (herein also indicted as "device") comprising a sheet-like light receiving side and a light exit side, the light collector device comprising a plurality of curved structures (herein also indicated as "structures") of light guiding material, wherein the light guiding material comprises an organic dye configured to absorb at least part of the light of a light source and to convert at least part of the absorbed light into converted light in the visible wavelength range, wherein each curved structure has a convex curved part at the light receiving side, configured to receive light from said light source and configured to couple light source light into the curved structure, a concave part at the light exit side, and a light exit edge part at the light exit side, wherein each curved structure has a curvature and light guide thickness) configured to facilitate transport of the incoupled light and the converted light in the visible wavelength range in the direction of the light exit edge part to provide device light escaping from the light exit edge part.

With such light collector device, efficiently (solar) light may be coupled into the curved structures, at least partly converted to light of another wavelength within the curved structures by the organic dye, and coupled out of the light collector device at the light exit edge parts. Thereby, collected (solar) light and/or collected converted (solar) light are provided. Note that the light source is not part of the basic embodiment(s) of the light collector device.

The light collector device is especially designed to collect light of the sun in an efficient way, and to couple the collected light, which is at least partly converted by the organic dye into luminescence, out at the light exit side (as luminescence and optional remaining solar light). Hence, in an embodiment the light collector is used to concentrate (solar) light, and to at least partially convert this concentrated solar light into luminescence (by conversion of at least part of the solar light with the dyes). Incoupled light and luminescence light may due to total internal reflection (TIR) migrate to the edge part and escape from the light exit part (or light exit edge part). To counteract a decrease in TIR properties of the light guide the organic dye is substantially not present as micro-particles, but is preferably molecularly distributed, thus to counteract omni-direction scattering of light. Furthermore, the dye has an absorption and/or excitation spectrum that essentially does not overlap with an emission spectrum of said dye, thus counteracting omni-directional re-emission of converted light. Both said omni-directional scattering and omni-direction re-emission result in an undesired decrease in the TIR properties of the light guiding material and hence in a less efficient solar light collector device.

The light collector device comprises a plurality of curved structures. In some embodiments these might comprise hemispherical structures, like domes, in other embodiments thee may comprise funnel like structures or sphere caps. The convex part is configured at the light receiving side. Hence, the light receiving side comprises a plurality of convex curved structures. The concave parts are at the "back side" (light exit side) of the light collector device. The edges of the curved structures are used as out coupling or light exit edge parts (at the light exit side). Hence, at least part of the edge of the curved structures are configured to allow incoupled light escape at the light exit side of the light collector device from the light exit edge parts of the curved structures.

Note that in the embodiments of the light collector device (per se), except for an optional coating, there is no physical structure upstream of the convex curved parts. It is the advantageous curved structure that provides efficient incoupling.

The terms "upstream" and "downstream" relate to an arrangement of items or features relative to the propagation of the light from a light generating means (here especially the sun or a light source), wherein relative to a first position within a ray of light from the light generating means, a second position in the ray of light closer to the light generating means is "upstream", and a third position within the ray of light further away from the light generating means is "downstream". In this way, one could indicate the light receiving side also as upstream side or upstream face, and the light exit side as downstream side or downstream face.

In general, the curved structures will be arranged in a regular pattern, like in cubic or hexagonal symmetry. Especially, the curved structures, especially the convex parts, may be configured in a close packing, such as a hexagonal closes packing or cubic close packing. Hence, the hemispherical structures or the funnel like structures, etc., may be arranged in a close packing, such as defined before. Hence, the light collector device may comprise a hexagonal close packing or cubic close packing of similar curved structures.

Optionally, there is a packing, or especially a close packing, of different types of structures. For instance, a combination of a plurality of hemispherical curved structures and funnel like curved structures, which alternate each other, may be applied. These may be packed (in two sub lattices of the respective curved structures), optionally in a close packing.

Not that the convex curved parts may thus lead to a protruding type of structure (protruding relative to a plane of the light collector device), such as the hemispherical like structures, but may in an embodiment also lead to indentation type structures, such as the funnel like structures.

The curved structures comprise, especially essentially consist of, even more especially are made from a transparent material, that is configured to allow at least visible light, but especially also parts of UltraViolet (=UV) and/or Infra-Red (=IR), propagate through the light guiding material. Another word for light guiding material is "wave guiding material". The light guiding or wave guiding material may comprises one or more materials selected from the group consisting of a transmissive organic material support, such as selected from the group consisting of PE (polyethylene), PP (polypropylene), PEN (polyethylene napthalate), PC (polycarbonate), polymethylacrylate (PMA), polymethylmethacrylate (PMMA) (Plexiglas or Perspex), cellulose acetate butyrate (CAB), silicone, polyvinylchloride (PVC), polyethylene terephthalate (PET), (PETG) (glycol modified polyethylene terephthalate), PDMS (poly dimethyl siloxane), and COC (cyclo olefin copolymer). However, in another embodiment the light guiding or wave guiding material may comprise an inorganic material. Preferred inorganic materials are selected from the group consisting of glasses, (fused) quartz, transmissive ceramic materials, and silicones. Also hybrid materials, comprising both inorganic and organic parts may be applied. Especially preferred are PMMA, PC, or glass as material for the waveguide.

Hence, the curved structures are especially curved light guides, with especially a curvature that is such, that there is a convex part and a concave part. Hence, the curved structures do especially not comprise circular optical fibers.

Especially, the dye is substantially not available as micro particles in the waveguide material, but is preferably molecularly distributed. In this way, there may substantially no grain boundaries be found, which is advantageous in view of scattering. Molecular distribution of the dye may especially be obtained when embedding the dye in an organic material, such as one or more of the above indicated transparent organic materials.

The organic dye is especially configured to absorb at least part the incoupled light source light and convert it into light of another wavelength. In general, this will (also) be visible light. However, the dye can be chosen to provide light in a wavelength area with a specific function. For instance, for horticulture applications, specific colors may have specific effect on plants, etc.

The dye may in an embodiment also be configured to convert UV light into visible light. Dependent upon the type of light of the light source (see below), the organic luminescent materials may for instance comprise a combination of green and red emitting materials, or a combination of yellow and red emitting luminescent materials, etc. However, dyes that convert UV or visible into IR may also be applied, dependent upon the (desired) application. For instance, in some horticulture applications, IR components may also be desired.

Further, as will be clear to a person skilled in the art, the term "dye" may also relate to a plurality of dyes of which two or more absorb and/or emit in different wavelength ranges. In this way, an optimized absorption and/or emission spectrum may be created. In a specific embodiment, two or more subsets of the total number of curved structures comprise two or more different dyes, respectively.

There is a nearly unlimited assortment of such organic luminescent materials or dyes. Relevant examples are perylenes (such as dyes known under their trade name Lumogen from the company BASF, Ludwigshafen, Germany: Lumogen F240 Orange, Lumogen F300 Red Lumogen F305 Red, Lumogen F083 Yellow, Lumogen F170 Yellow, Lumogen F850 Green), Yellow 172 from the company Neelikon Food Dyes & Chemical Ltd., Mumbai, India, and dyes such as coumarins (for example Coumarin 6, Coumarin 7, Coumarin 30, Coumarin 153, Basic Yellow 51), napthalimides (for example Solvent Yellow 11, Solvent Yellow 116), Fluorol 7GA, pyridines (for example pyridine 1), pyrromethenes (such as Pyrromethene 546, Pyrromethene 567), uranine, rhodamines (for example Rhodamine 110, Rhodamine B, Rhodamine 6G, Rhodamine 3B, Rhodamine 101, Sulphorhodamine 101, Sulphorhodamine 640, Basic Violet 11, Basic Red 2), cyanines (for example phthalocyanine, DCM), stilbenes (for example Bis-MSB, DPS), available from many traders. Several other dyes, such as acid dyes, basic dyes, direct dyes and dispersion dyes may be used as long as they show a sufficiently high fluorescence quantum yield for the intended use. Organic materials of special interest that may be applied comprise for instance BASF Lumogen 850 for green luminescence, BASF Lumogen F083 or F170 for yellow luminescence, BASF Lumogen F 240 for orange luminescence, and BASF Lumogen F 300 or F305 for red luminescence. Optionally, the dye comprises a phosphorescent dye, that has a long decay time, such as hours, which may be applied for lighting during absence of (enough) daylight.

The term white light herein, is known to the person skilled in the art. It especially relates to light having a correlated color temperature (CCT) between about 2000 and 20000 K, especially 2700-20000 K, for general lighting especially in the range of about 2700 K and 6500 K, and for backlighting purposes especially in the range of about 7000 K and 20000 K, and especially within about 15 SDCM (standard deviation of color matching) from the BBL (black body locus), especially within about 10 SDCM from the BBL, even more especially within about 5 SDCM from the BBL.

The terms "violet light" or "violet emission" especially relates to light having a wavelength in the range of about 380-440 nm. The terms "blue light" or "blue emission" especially relates to light having a wavelength in the range of about 440-490 nm (including some violet and cyan hues). The terms "green light" or "green emission" especially relate to light having a wavelength in the range of about 490-560 nm. The terms "yellow light" or "yellow emission" especially relate to light having a wavelength in the range of about 560-590 nm. The terms "orange light" or "orange emission" especially relate to light having a wavelength in the range of about 590-620. The terms "red light" or "red emission" especially relate to light having a wavelength in the range of about 620-750 nm, especially 620-650 nm. The terms "visible", "visible light" or "visible emission" refer to light having a wavelength in the range of about 380-750 nm. The term "IR" (infra red), may especially relate to about 750-3000 nm, especially in the range of about 750-1100 nm.

When using (a) solar cell(s) (for receiving the collected light of the light collector), the dye(s) may be optimized to provide a luminescence spectrum that is especially adapted to the wavelength dependence sensitivity of the solar cell(s).

As indicated above, the light source is not part of the basic embodiments of the invention. Especially, the light collector device is used to collect (and at least partially convert) solar light. Hence, in an embodiment the term "light source" may relate to the sun. However, optionally, one or more artificial light sources may be applied to collect light (and convert) light from.

In an embodiment (see also below), solar light is collected, and the light collector device is used as lighting unit. In this embodiment, optionally one or more artificial light sources may also be integrated in the lighting unit. The light of those artificial light sources may optionally be collected with the light collector device, but may in another embodiment be used as auxiliary light source without the light being collected and/or converted. Combinations of such embodiments are also possible.

The curvature and light guide thickness of the curved structures are especially chosen to have good light incoupling and total internal reflection. It appears that curved structures which are concave (with air or another gas in contact with the concave part), and with the convex part as light receiving surface, and which are relatively thin have good properties in the sense of internal reflection and conversion by the dye. Especially, the light guide thickness is selected from the range of 0.5-50 mm, even more especially from the range of 0.5-10 mm, such as 1-5 mm.

An aspect of light conversion in a transparent system (e.g. a luminescent dye dissolved in PMMA or PET; see also above) is the observation that the (isotropic) light emission, generated in the material, is trapped for a significant part. In case of a rectangular shaped luminescent polymer the useful fraction of the total amount of light generated is (see also FIG. 1a):

$$6 * \sin\left(\frac{a\sin(1/n)}{2}\right)^2 \quad \{1\}$$

which is 76.4% (i.e. 23.6% of the light is trapped in the material). In formulas 1-5, asin relates to arcsine. In case of luminescence in a disk shaped geometry (FIG. 1b) the useful fraction is $$2 * \sin\left(\frac{a\sin(1/n)}{2}\right)^2 + 1 - 2 * \sin\left(\frac{\pi/2 - a\sin(1/n)}{2}\right)^2 \quad \{2\}$$

which is 92.1% (7.9% of the light is trapped). I.e. the disk is much more efficient than the rectangular shaped luminescent polymer.

Both the rectangular plate and disk show a high fraction of light escaping via the edges. For a rectangular plate, the fraction of the light released from the edges is 2/3=66.7% of the total amount of escaped light. In case of a disk shaped geometry the edge fraction is $$\frac{1 - 2 * \sin\left(\frac{\pi/2 - a\sin(1/n)}{2}\right)^2}{2 * \sin\left(\frac{a\sin(1/n)}{2}\right)^2 + 1 - 2 * \sin\left(\frac{\pi/2 - a\sin(1/n)}{2}\right)^2} \quad \{3\}$$

which yields 72.3% of the total amount of escaped light.

The use of clear, dye-based luminescent films for converting light is in general quite inefficient because a large part of the light travels to the edges (generating a large optical path and consequently a high loss).

An aspect of this invention is to use in particular the "edge light" to generate an optical sheet component, emitting light for a large part in only one ("downward") direction. By transforming the disk into e.g. a hemispherical shape (see e.g. also FIG. 1e), especially having relatively thin walls, the fraction of light directed downwards is estimated to be:

$$\sin\left(\frac{a\sin(1/n)}{2}\right)^2 + 1 - 2 * \sin\left(\frac{\pi/2 - a\sin(1/n)}{2}\right)^2 \quad \{4\}$$

This yields 79.3% of the total amount of light generated in the hemispherical cup. The ratio of the light flux down and total emitted flux may be estimated by $$\frac{\Phi_{down}}{\Phi_{total}} \approx \frac{\left(\frac{a\sin(1/n)}{2}\right)^2 + 1 - 2 * \sin\left(\frac{\pi/2 - a\sin(1/n)}{2}\right)^2}{2 * \sin\left(\frac{a\sin(1/n)}{2}\right)^2 + 1 - 2 * \sin\left(\frac{\pi/2 - a\sin(1/n)}{2}\right)^2} \quad \{5\}$$

The ratio of light flux down and total flux 0.86. For effective use of this 3D shape it is assumed that the wall light guide thickness d is small compared to the outer radius R. This ensures light guiding of the generated light towards the edges (preferably: d/R<0.25). The amount of trapped light is reduced by making the edges rough. Consequently, the down/total flux ratio increases (slightly) to 0.87. In FIGS. 1a-1b, the downwards flux is indicated with Φ. In formula 5, Φtotal is the total luminescenct flux (lm) and Φdown is the luminescent flux directed downwards (lm).

Another aspect of the invention is that the generated light is highly diffuse (in contrast to the highly directed light from the sun). In greenhouses, diffuse light is more effective for plant growth than direct (directional) light from the sun. (Also the unconverted incoming light is spreaded/scattered to some extend). Based on the described principles, it is able to construct a number of practical shapes for use as an efficient and low-cost light converter for use in e.g. greenhouses.

Assuming a sphere cap structure, especially a hemispherical curved structure, the surface area (S) of an upper half may be defined as in equation 6:

$$S_{ellipsoid} \approx 2\pi\left(\frac{a^p b^p + a^p c^p + b^p c^p}{3}\right)^{1/p} \quad p = 1.6075 \quad \{6\}$$

For an oblate hemispherical curved structure, a=b=1; c<1; for a prolate hemispherical curved structure, such as a sphere cap, a=b=1; c>1. The parameters a, b, and c are indicated in FIG. 1k. For the calculations, a and b are normalized to 1 and c is varied. The constant p can be used for a wide range of a, b and c values. For c=1 (sphere): S=6.3; for c=0.2 (oblate spheroid): S=3.5 ; for c=5 (prolate spheroid): S=25.0

Hence, in a specific embodiment, each curved structure, especially each sphere cap, such as a hemispherical structure, has a ground plane radius (R), wherein the convex curved part having said ground plane radius (R) has a curved structure surface area (S), wherein the curvature of the convex curved part has a normalized area in the range $2.5 \leq S/R^2 \leq 30$, and has a light guide thickness (d) which is selected from the range of 0.5-50 mm. Even more especially, each curved structure (10) has a ground plane radius (R), wherein the curved structure (10) has the shape of a sphere cap, wherein the convex curved part (11) having said ground plane radius (R) has a curved structure surface area (S), wherein the curvature of the convex curved part has a normalized area in the range $2.5 \leq S/R^2 \leq 30$, and has a light guide thickness (d) which is selected from the range of 0.5-50 mm. This may especially apply to hemispherical sphere caps or domes.

Especially good results seem to be obtained in embodiments wherein the ratio of the light guide thickness and ground plane radius (d/R) is $0.001 \leq d/R \leq 0.25$. Further, it appears that good light collector devices may be obtained when the plurality of curved structures have a ground plane radius (R) selected from the range of 0.25-100 mm, and wherein the convex curved part having said ground plane radius (R) has a curved structure surface area (S) in the range of 10 mm$^2$-0.3 m$^2$. This may especially apply to hemispherical curved structures. In case the curved structure has not a circular cross-section (i.e. R varies within the ground plane), the radii are averaged, to obtain a mean value for R. This mean value can be used in the herein defined conditions, such as that the ground plane radius (d/R) is $0.001 \leq d/R \leq 0.25$. In case of a curved structure not being a spherical cup, such as a hemisphere, the radius of the curvature may be used as R.

Further, especially at least 20% of the surface area of the convex curved parts have a local curvature $0.2 \leq \kappa R < 5$ wherein $\kappa$ is the local curvature of a fitting circle in a cross-sectional plane of the convex curved part describing the local curvature, and wherein R is the radius of a ground plane (see also below). Especially at least 30% of the surface area of the convex curved parts have such local curvature, like 20-90%, like 30-70%.

The curved structures may preferably have high symmetry. However, also distorted curved structures may be applied, like a hemispherical curved structure that is elongated (for instance a sphere cap, such as a hemispherical structure with a≠b). In such instance, R can be chosen as a mean value (average radius). Further, optionally also parts or sections of specific curved structures may be applied. Hence, below it is also indicated that segments may be applied. In an embodiment, this relates to a part (i.e. not the entire) of such specific curved structure may be applied, such as part, like a triangular part, of such specific curved structure. However, in another embodiment, the term "segment" may also refer to the entire specific structure, such as a entire half dome, or an entire hemisperhical curved structure. As the curved structures have a convex and concave part, the term "sphere cap" especially refers to a cap of a hollow sphere.

The light receiving side or surface of the light collector device may thus comprise curved structures, which when perceived by an observer from the light receiving side are convex. Likewise, the light exit side may thus comprise curved structures, which when perceived by an observer from the light receiving side are concave.

The surface area of the light receiving side is thus a summation of the surfaces of the surface areas of the convex curved parts curved structures and optional intermediate surface area. Especially, 20-95%, especially 30-95%, of the surface area of the light receiving side is covered with the convex curved structures. Hence, preferably at least 20% of the surface area is curved, and even more preferably has the herein indicated curvature (as expressed in an embodiment as normalized area).

As already indicated above, the curved structures may be funnel like structures. Hence, in an embodiment, the curved structures have the shape of segments of 2D curved funnels, with larger first openings at the light receiving side and smaller second openings at the light exit side. In a specific embodiment, the curved structures are 2D curved funnels, with larger first openings at the light receiving side and smaller second openings at the light exit side.

Here, the term "2D curved" funnels is applied in order to indicate that the radius of the funnel over the funnel axis does not decrease (or increase) linearly, but increase non-linearly in order to provide convex curved part. Hence, the funnel is curved in a cross-sectional views perpendicular to a (longitudinal) funnel axis (which will per se be the case with a funnel), as in these cross-sectional views in general circles will be found. However, also in cross-sectional views parallel to the (longitudinal) funnel axis, curved structures will be found, with the convex part at the light receiving side and with concave part at the light exit side. A tapered structure in general has a larger opening at one side, and tapers to a smaller opening. Here, the tapering is non-linear (2D curved).

The funnels can be seen as indentations in the light collector device or the light receiving side thereof, with the larger opening at the light receiving side and the smaller openings at the light exit side.

Optionally, these openings are absent, and there is no through-hole. Hence, the invention also provides an embodiment of the light collector device, wherein the curved structures have the shape of segments of 2D curved indentations, with larger first openings at the light receiving side and a closed extending end comprising the light exit edge part at the light exit side. In a specific embodiment, the curved structures are 2D curved indentations, with larger first openings at the light receiving side and a closed extending end comprising the light exit edge part at the light exit side. Such funnels may be indicated as tapered end closed funnels. An indentation in general has a larger opening at one side, and tapers to a smaller part, that is closed. Would at the taper end be an opening, such indentation is herein called "funnel".

As indicated above, instead of or in addition to funnel like (such as including indentation like) curved structures, in an embodiment the curved structures have the shape of segments of hollow sphere caps, with convex curved parts at the light receiving side and concave parts at the light exit side. In a specific embodiment, the curved structures are hollow sphere caps, with convex curved parts at the light receiving side and concave parts at the light exit side. Note that the segments of hollow sphere cap may be halve spheres (herein also indicated as "hemispherical curved structures"). In geometry, a spherical cap is a portion of a sphere cut off by a plane. If the plane passes through the center of the sphere, so that the height of the cap is equal to the radius of the sphere, the spherical cap is called a hemisphere. Hence, in an embodiment, one or more of the sphere caps, especially all of the sphere caps of the light collector device are hemispherical.

In yet another embodiment, the curved structures have the shape of segments of convex gutters, with convex parts at the light receiving side and concave parts exit side. In a specific embodiment, the curved structures are convex gutters, with convex parts at the light receiving side and concave parts exit side. In this way, a kind of corrugated structure may be obtained. Especially, the distance between two adjacent convex gutters is small, especially they may touch each other at the base or even have a mutual base.

As indicated above, a light collector device may comprise different types of curved structures.

In an embodiment, separate spherical caps, such as hemispheres, are interlinked, e.g. via a very thin, transparent sheet. Likewise, this may apply to the convex gutters.

In a further specific embodiment, which may relate to any of the above embodiments, but especially to embodiments of the hemispherical curved structures (including sphere sections), the light collector device comprises first curved structures and second curved structures, the first curved structures enclosing the second curved structures, wherein the dye in the waveguide material of the first curved structures differs from the dye in the waveguide material of the second curved structures. The first curved structure may be arranged to pass at least part of the light of the light source. This non-absorbed light may then be at least partially absorbed by the second curved structure, which is enclosing the second curved structure.

The light collector device is herein indicated as being sheet-like. Hence, the light collector device may substantially have the shape of a sheet, though the convex parts at one side, and the concave parts at the other side may protrude from an imaginary flat plane.

The term "sheet-like" may especially indicate a continuous layer, with a larger length and width than height. Especially, the height including the curved structures of the light collector device is in the order of 1 mm-100 mm, such as 2-50 mm. The length and the width of the light collector device may for instance both be in the range of 10 cm-20 m; especially the light collector device area, defined by l*w (length*width) is in the range of $0.01$-$50$ $m^2$, such as $0.2$-$20$ $m^2$. In the sheet-like light collector device, the light receiving side and light exit side are arranged opposite of each other. The light exit parts are configured at the light exit side.

The light collector device may be applied in all kind of devices and may be used for all kind of applications, especially due to its efficient light capture, light conversion, and light outcoupling. Light from a light source, such as the sun, is collected by the light collector device at the light receiving side, and leaves (at least partly as converted light) the light exit side at the light exit parts. The light within the light guide thus at least partly escapes from the edge of the curved structure, i.e. (at) the light exit side. An advantageous aspect of the curved structures is that the edge surface is minimized and substantially all edge surface has the function of light exit part. During use, collected light source light and/or converted light source light may thus emanate from the light exit parts (at the light exit side).

For instance, the light collector device may be used in a solar device. Hence, in a further aspect, the invention provides a solar device comprising the light collector device as defined herein and a solar cell, wherein the solar cell is configured to receive light escaping from the light exit edge part.

In yet a further aspect, the invention provides a greenhouse comprising the light collector device as defined herein, wherein the collector device is configured to provide light via the light exit edge parts into the greenhouse.

In yet another aspect, the invention provides a lighting unit, comprising the light collector device as defined herein, a plurality of light sources, and optionally a diffusor plate, wherein the light sources are configured to provide light source light to the light receiving side, and wherein the optional diffusor plate is configured between the plurality of light source and the light collector device.

An important application area of the light collector device is greenhouses. Walls and/or roofs of the greenhouse may be cladded with the invented sheet. The light collector device may also be positioned in an intermediate position in the greenhouse (not connected directly to the glass). The light collector device can also be (1D) curved into e.g. a cylinder shape. Plants may be placed into this cylinder. The light collector device may also be used in the "open field" as a sheet placed directly on the plants. In this example UV blocking agents (and/or UV light to visible and/or IR light conversion dyes) may also incorporated in the foil to protect the crop from too much harmful UV. The invented light collector device may also used in combination with blue or white (phosphor converted) LEDs in luminaires for horticultural or general lighting. The structure of the light collector device may advantageously avoid the use of scattering pigments and is an efficient way to convert light. The light collector device can also have very interesting additional decorative properties when used in large area lighting applications (lighting for offices, schools, retail).

The term "substantially" herein, such as in "substantially all emission" or in "substantially consists", will be understood by the person skilled in the art. The term "substantially" may also include embodiments with "entirely", "completely", "all", etc. Hence, in embodiments the adjective substantially may also be removed. Where applicable, the term "substantially" may also relate to 90% or higher, such as 95% or higher, especially 99% or higher, even more especially 99.5% or higher, including 100%. The term "comprise" includes also embodiments wherein the term "comprises" means "consists of".

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

The devices herein are amongst others described during operation. As will be clear to the person skilled in the art, the invention is not limited to methods of operation or devices in operation.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "to comprise" and its conjugations does not exclude the presence of elements or steps other than those stated in a claim. The article "a" or "an" preceding an element does not exclude the presence of a plurality of such elements. The invention may be implemented by means of hardware comprising several distinct elements, and by means of a suitably programmed computer. In the device claim enumerating several means, several of these means may be embodied by one and the same item of hardware. The mere fact that certain measures are recited in mutually different dependent claims does not indicate that a combination of these measures cannot be used to advantage.

The invention further applies to a device comprising one or more of the characterizing features described in the description and/or shown in the attached drawings.

The various aspects discussed in this patent can be combined in order to provide additional advantages. Furthermore, some of the features can form the basis for one or more divisional applications.

BRIEF DESCRIPTION OF THE DRAWINGS

Embodiments of the invention will now be described, by way of example only, with reference to the accompanying schematic drawings in which corresponding reference symbols indicate corresponding parts, and in which.

The drawings 1a-3c and 4-5h are not necessarily on scale.

DETAILED DESCRIPTION OF THE EMBODIMENTS

Figure 1A:
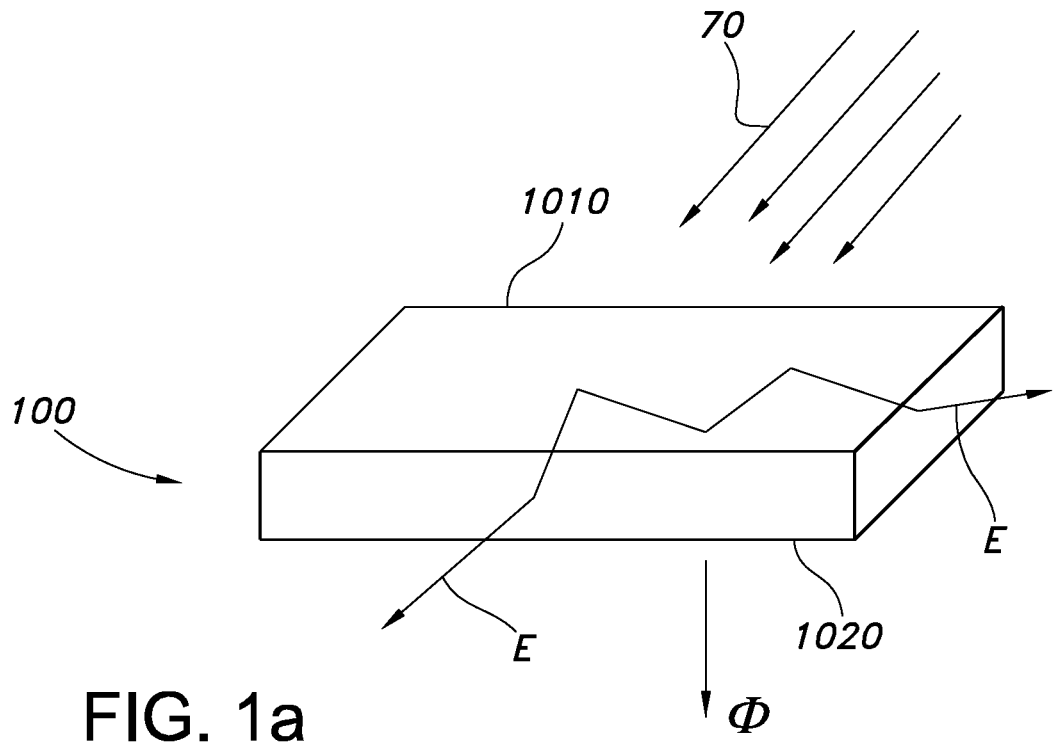
FIGS. 1a-1l schematically depict some principles, and aspects and embodiments of the invention.
Figure 1B:
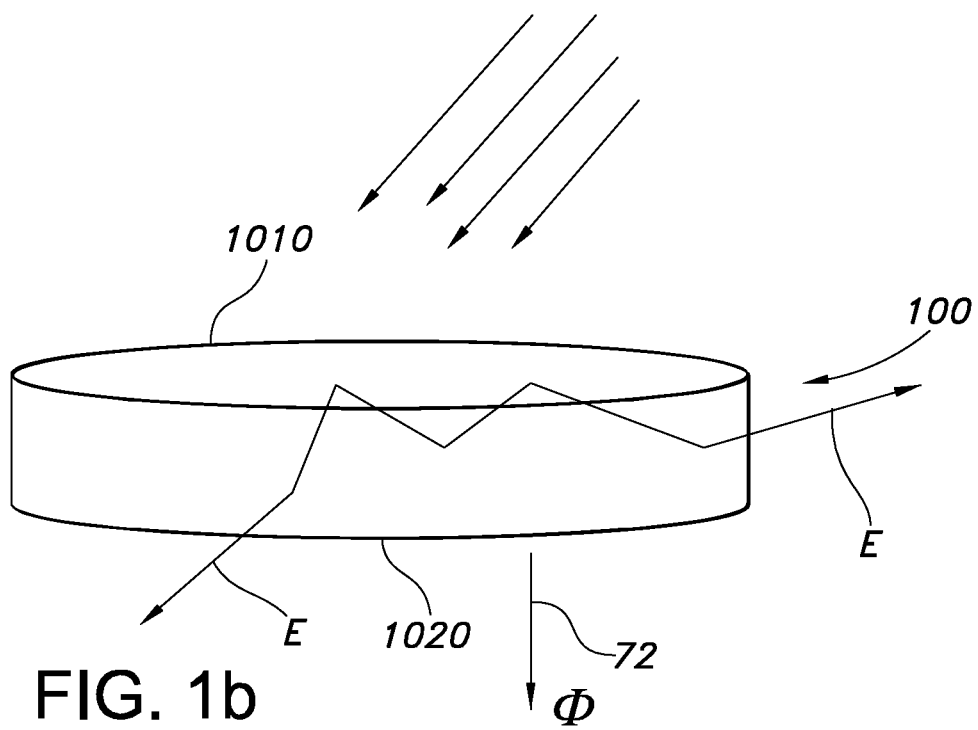

FIGS. 1a-1b schematically depict a transparent a rectangular shaped luminescent polymer and a disk shaped luminescent polymer, respectively. The light receiving side is indicated with reference 1010 and the light exit side is indicated with reference 1020. Light, such as solar light, is indicated with reference 70. Part of the light may escape from the edges, and part of the light may escape from the light exit edge part 1020. The former is indicated with "E"; the latter part is indicated here with the symbol Φ.

In case of a rectangular shaped luminescent polymer (FIG. 1a) the useful fraction of the total amount of light generated is 76.4% (i.e. 23.6% of the light is trapped in the material). In case of luminescence in a disk shaped geometry (FIG. 1b) the useful fraction is 92.1% (7.9% of the light is trapped). Hence, the disk is much more efficient than the rectangular shaped luminescent polymer.

Both the rectangular plate and disk show a high fraction of light escaping via the edges (E). For a rectangular plate, the fraction of the light released from the edges is 2/3=66.7% of the total amount of escaped light. In case of a disk shaped geometry the edge fraction (E) is 72.3% of the total amount of escaped light.

Figure 1C:
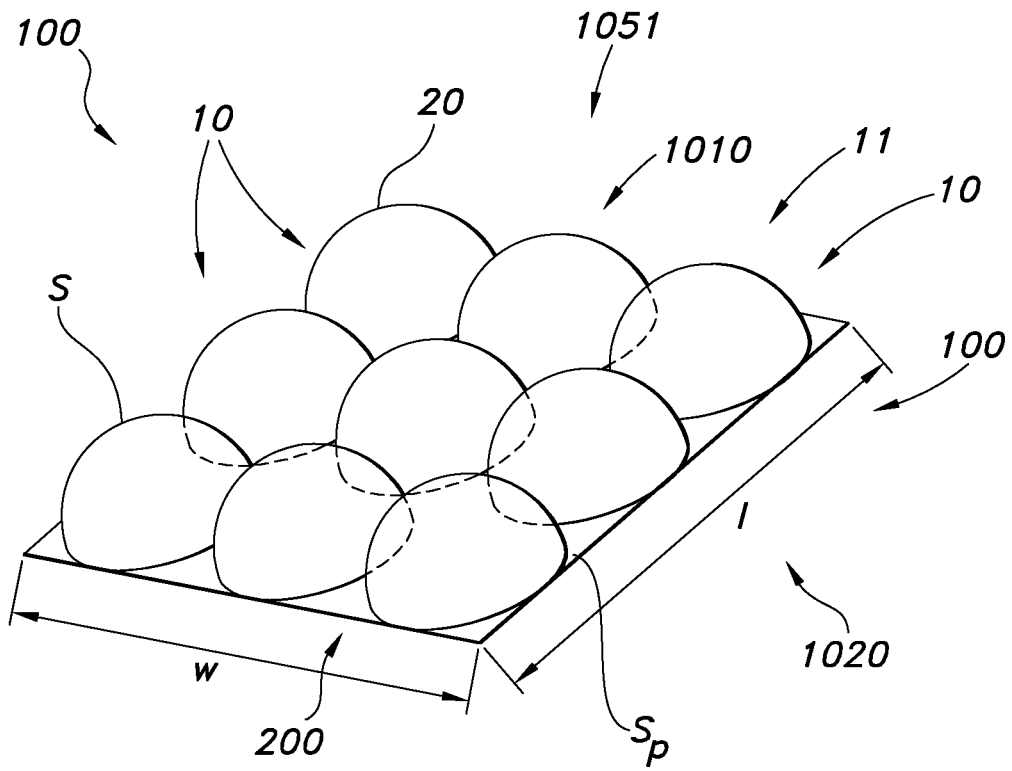
Figure 1D:
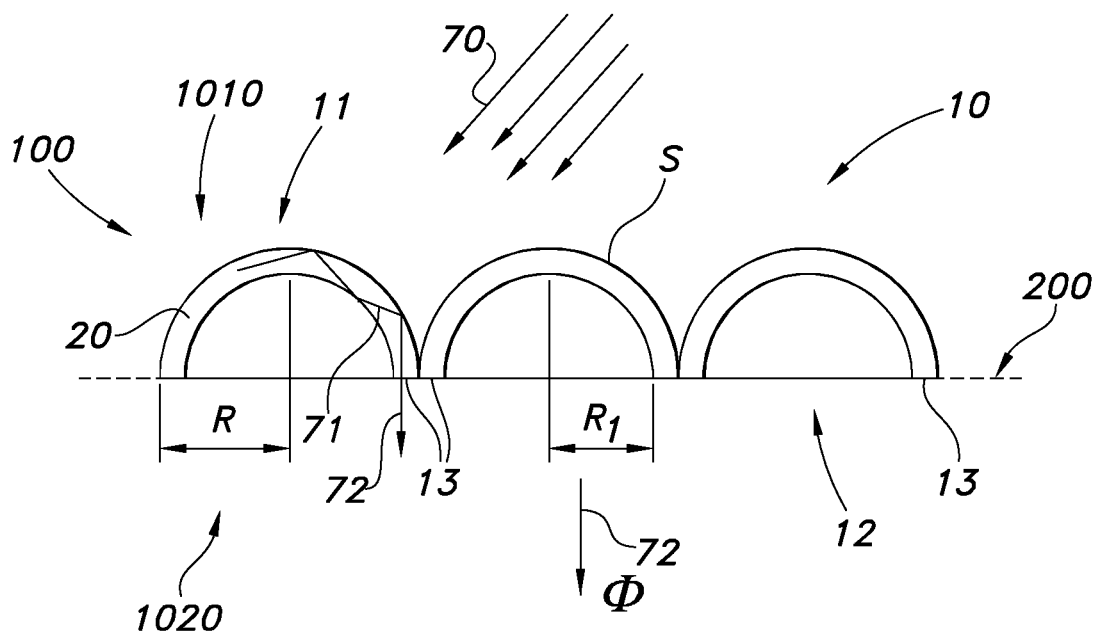
Figure 1E:
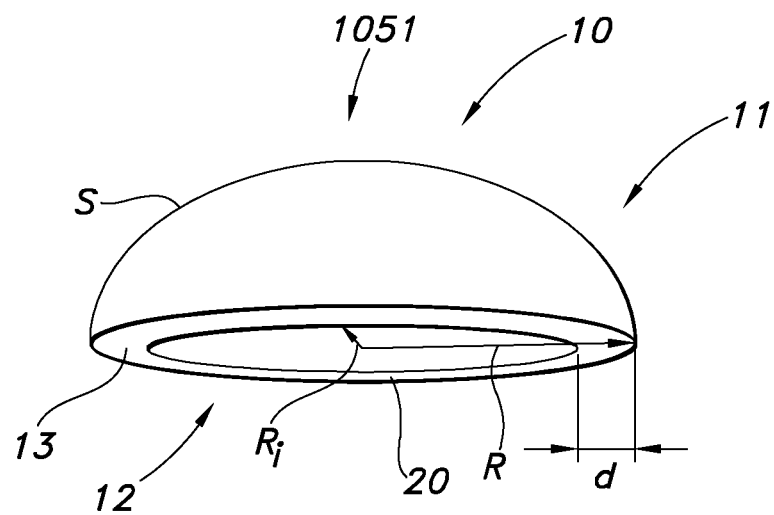

By transforming the disk into a hemispherical shape, having relatively thin walls (cups; FIGS. 1c-1e), the fraction of light directed downwards is 79.3% of the total amount of light generated in the hemispherical cup. The ratio of the light flux down and total emitted flux may be 0.86. For effective use of this 3D shape it is assumed that the wall light guide thickness d is small compared to the outer radius R. This ensures light guiding of the generated light towards the edges (preferably: d/R<0.25). Optionally, the amount of trapped light is reduced by making the edges rough. Consequently, the down/total flux ratio increases (slightly) to 0.87.

FIGS. 1c-1d schematically depict an embodiment of the light collector device 100 comprising light receiving side 1010 and light exit side 1020. The light collector device 100 further comprises a plurality of curved structures 10 (at the light exit side 1010) of light guiding material 20. The light guiding material 20 comprises an organic dye configured to absorb at least part of the light of a light source and to convert at least part of the absorbed light into converted light in the visible and IR wavelength range. Each curved structure 10 has a convex curved part 11 at the light receiving side 1010. This convex curved part 11 is especially configured to receive light (70) from said light source and configured to couple light source light into the curved structure. Further, each curved structure 11 comprises a light exit edge part 13 at the light exit side 1020. Each curved structure 10 has a curvature and light guide thickness d configured to facilitate transport of the incoupled light and the converted light in the visible wavelength range in the direction of the light exit edge part 13 to provide device light escaping from the light exit edge part 13.

FIGS. 1c-1d schematically depict embodiments wherein the curved structures 10 comprise sphere caps, which are indicated with reference 1051. FIG. 1d shows sphere caps in the form of hemispherical structures. Note that in FIG. 1d the curved structures are in physical contact with each other, as might be the case in a hexagonal or cubic (FIG. 1c) closed packing. Alternatively or additionally, separate spherical caps, such as hemispheres, are interlinked, e.g. via a (very thin), transparent sheet (see also FIGS. 3a-3c), herein also indicated as bottom plate.

As is clear from these and other figures, the light receiving side 1010 and the light exit side 1020 are two opposite sides of the sheet-like concentrator device 100. The former comprises the convex parts; the latter comprises the convex parts, and optionally a further transparent sheet (bottom plate)

Reference S refers to the surface of the convex curved part of the respective curved structure 10. Reference Sp relates to the total surface area of the light receiving side 1010, i.e. the sum of the total surface area of the curved structures (ES with "i" indicating the respective spheres) and the total surface area of the light receiving side 1010 between the curved structures. Preferably at least 20%, especially at least 30%, of this surface area is curved. Reference R refers to the ground plane radius of the curved structure 10, i.e. the radius of the convex curved part 11; reference R1 refers to the ground plane radius of the concave curved part 12. The former is used for defining the desired normalize area range, which is: $2.5 \leq S/R^2 \leq 30$.

Reference 70 relates to light of an external source, such as solar light; reference 71 relates to incoupled light source light, thus within the light guiding material, and reference 72 refers to outcoupled light source light at the light exit side 1020. The light emanating from the light exit side 1020 is also indicated with Φ (see also above). Reference 200 refers to a plane of the light collector device. Relative to this plane 200, the curved structures 10 may protrude or deepen (in the case of e.g. funnels).

FIG. 1e in more detail schematically depicts an embodiment of a sphere cap as curved structure 10. The sphere cap is indicated with reference 1051. The light guide thickness, or light guide thickness, is indicated with reference "d". Especially, the ratio of the light guide thickness d and ground plane radius (d/R) is $0.001 \leq d/R \leq 0.25$. The sphere cap is a cap of a hollow sphere, having a external radius R, and an internal radius Ri, which is R−d.

Figure 1F:
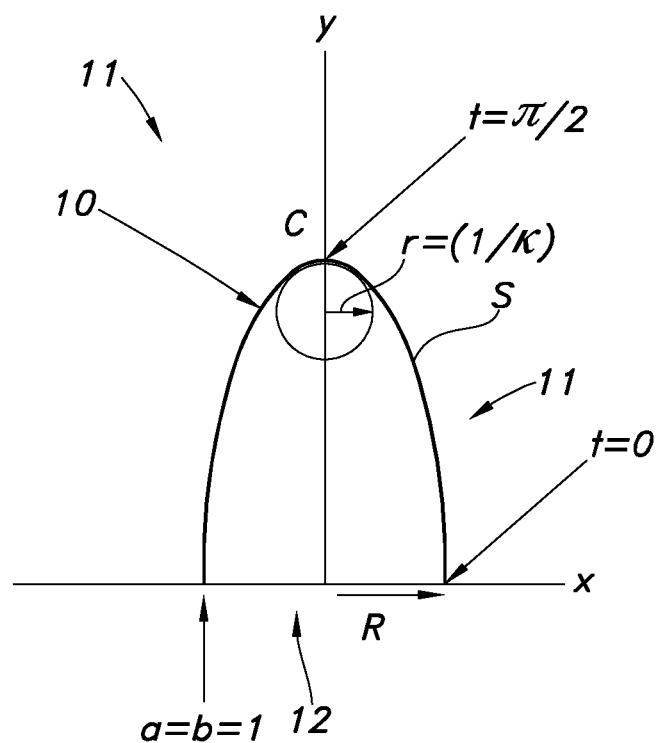

FIG. 1f is used to describe the curvature of the convex curved surface. An ellipse is used as model to describe the curvature. The ellipse is described with:

$$x = \cos(t)$$

$$y = c^* \sin(t)$$

The circle is used as osculating circle. The parameters a (along the x-axis) and b (along the z-axis; out of the plane, not depicted), are chosen to be 1. The top of the ellipse is at t=n2; the base of the circle is at t=0. The local curvature, indicated with κ is defined as:

$$\kappa = \left| \frac{\frac{dx}{dt} * \frac{d^2y}{dt^2} - \frac{dy}{dt} * \frac{dx^2}{dt^2}}{\left\{ \left(\frac{dx}{dt}\right)^2 + \left(\frac{dy}{dt}\right)^2 \right\}^{3/2}} \right|$$

The parameter thus relates 1/radius of osculating circle (this radius is indicated with reference r in FIG. 1f. For a circle (c=1), a relative flat ellipse (c=0.2), and for a relative high ellipse (c=5), the following values for the local κ curvature are obtained:

For c=1 (a circle): κ=1 (t=π/2)

For c=0.2: κ=0.2 (t=π/2)

For c=5: κ=5 (t=π/2)

Hence, from these date it is derived that the local curvature of the convex curved part is preferably:

0.2<κR<5

With these data, also an advantageous light guide thickness of the curved structure can be defined, as a normalized thickness, normalized to the radius at the base:

$$\frac{d}{R} < 0.25$$

Especially, the ratio light guide thickness (d) and ground plane radius (d/R) is 0.001≤d/R≤0.25.

FIGS. 1g-1j schematically depict embodiments of curved structures 10. These curves structures are depicted in a cross-sectional way, and could for instance be cross section of curved structures of identical or similar light collector devices 100 as schematically depicted in FIGS. 2a-3c. This is especially clear when these light collector devices 100 are schematically depicted in cross section, such as in FIGS. 2c, 2f, 2i, 2j and 3a. For instance, when comparing FIG. 1g with FIGS. 2c, 2f, 2i, 2j and 3a, FIG. 1g could both reflect parts of the curved parts of two adjacent curved structures 10 (see FIGS. 2j and 3a), or reflect a indentation like structure (see FIGS. 2a-2i).

Figure 1G:
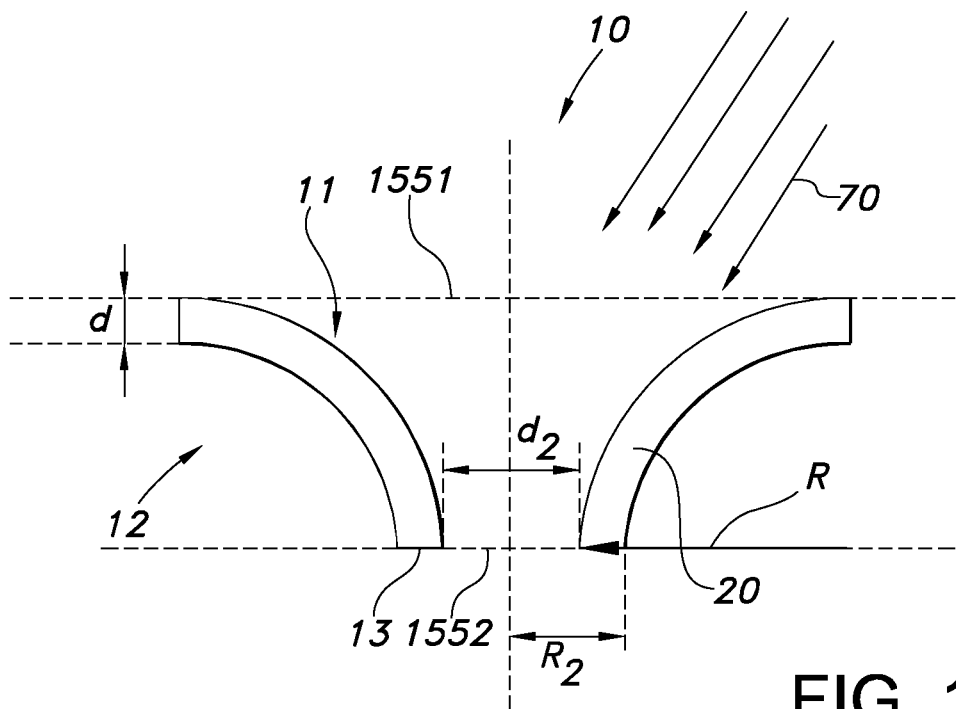

FIG. 1g could thus both reflect parts of the curved parts of two adjacent curved structures 10 or reflect an indentation like structure (see above, and also below), as the two curved structures can be a cross-section of two adjacent funnels as well as two adjacent (hemispherical) sphere caps. Especially, for each part on the curved structure a value for R and d can be evaluated. Further, for the entire curved structure 10, or segments thereof, the surface area S can be determined (see also below).

Figure 1H:
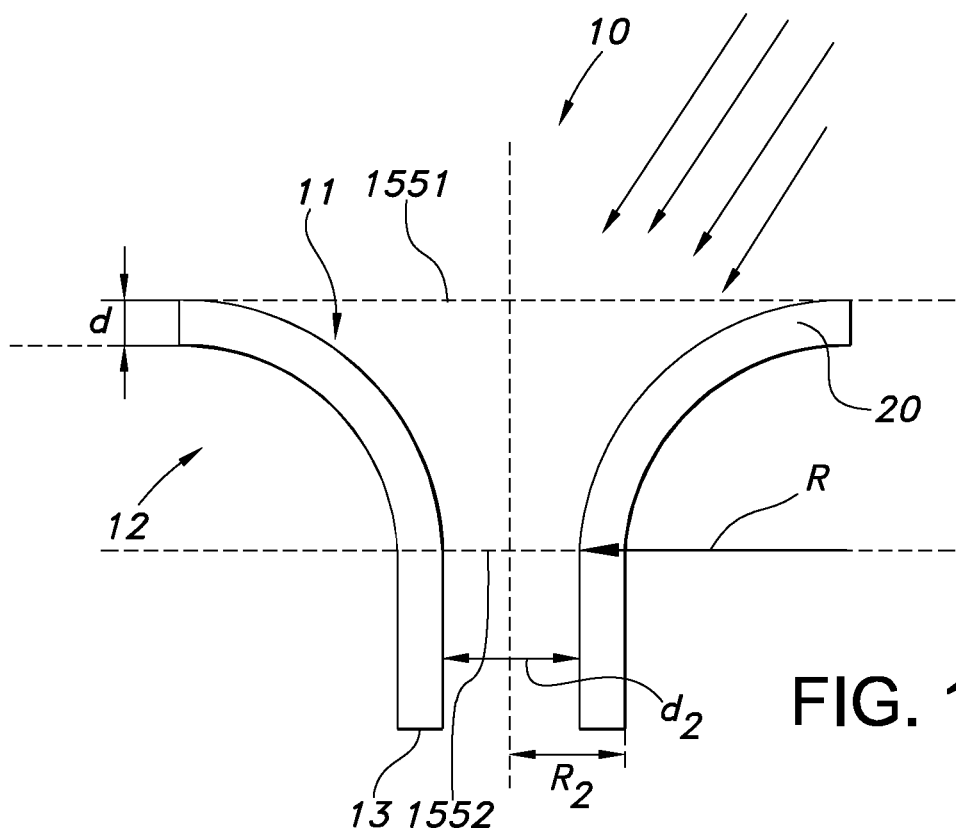
Figure 1I:
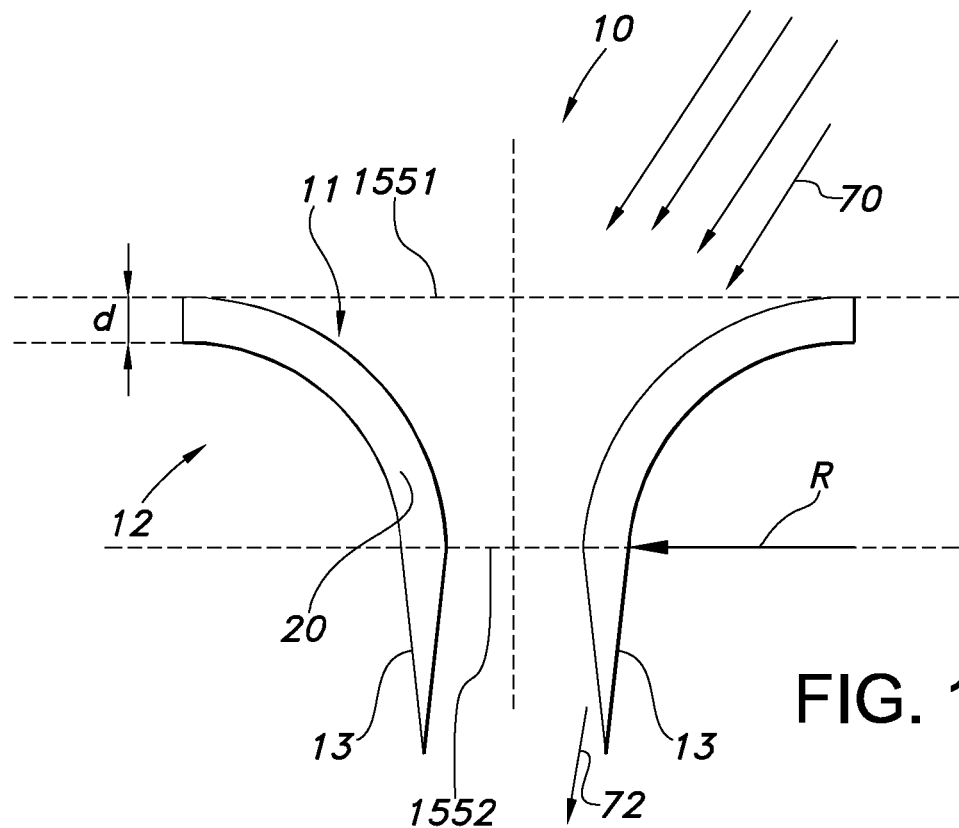
Figure 1J:
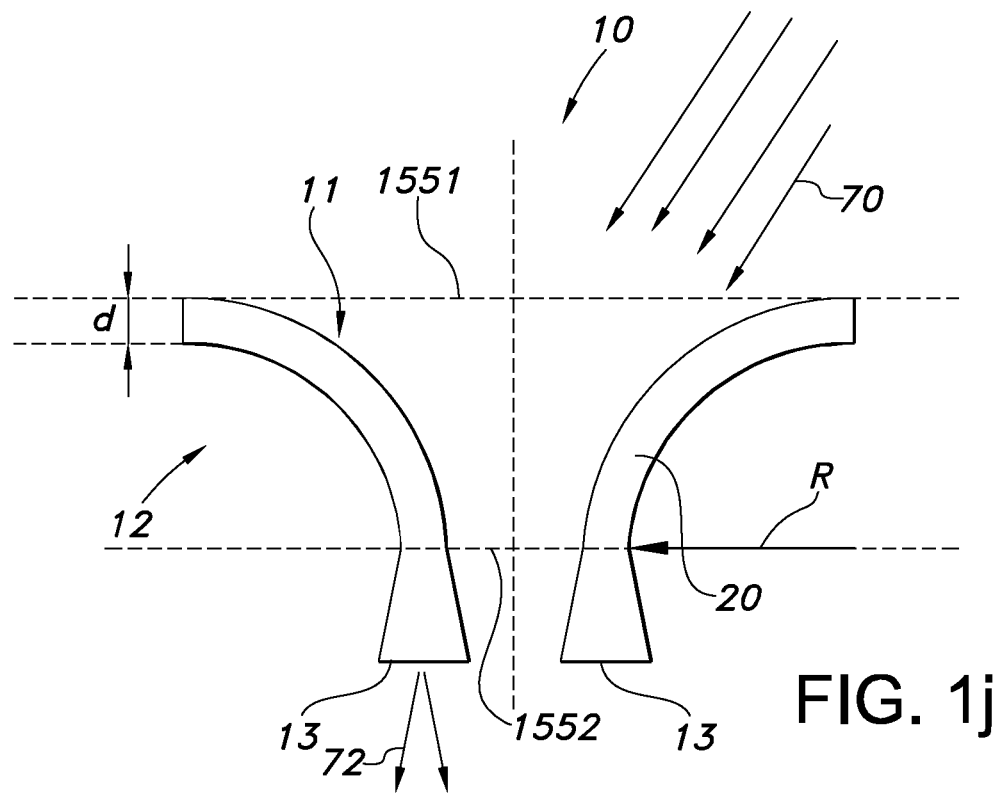

FIGS. 1h-1j schematically depict embodiments wherein the indentations or sphere caps have elongation at the edges or elongated edges. These elongations can have a tapered structure (FIG. 1i) or a widening structure (FIG. 1j). In the former embodiment, the value of d decreases at the light exit edge part; in the latter the value of d increases.

FIGS. 1g-1j include the option that there is a physical opening, herein indicated as second opening 1552, as can also be seen in the embodiments of FIGS. 2a-2f. However, such openings may also be absent, as schematically depicted in FIGS. 2j-2i and/or may be closed with a transparent bottom plate (see also FIGS. 3a-3c).

Assuming indentations, such as funnels, the top opening or first opening is indicated with reference 1551. The second opening has an internal diameter indicated with reference d2 and an external radius indicated with R2.

Note that, except for an optional coating, there is no physical structure upstream of the convex curved parts. It is the advantageous curved structure that provides efficient incoupling of light of a light source, such as of the sun.

Figure 1K:
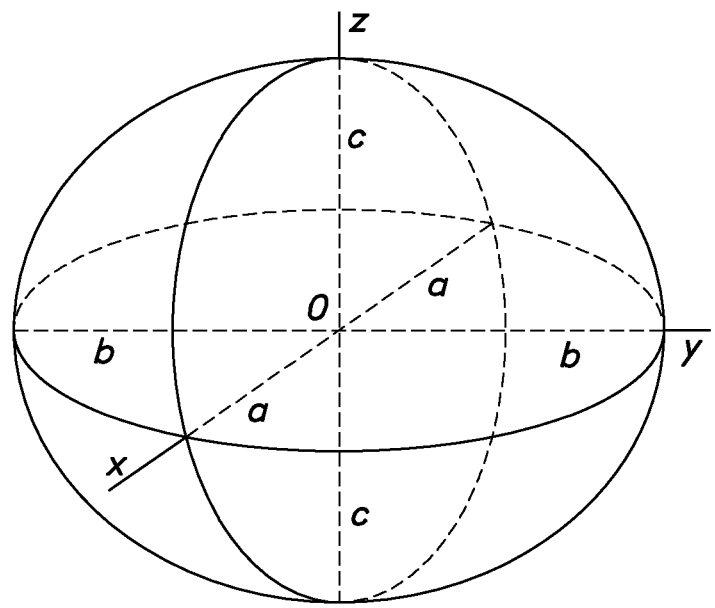

FIG. 1k is depicted to further illustrate the parameters of the formula for calculating the surface are surface cap (see above).

Figure 1L:
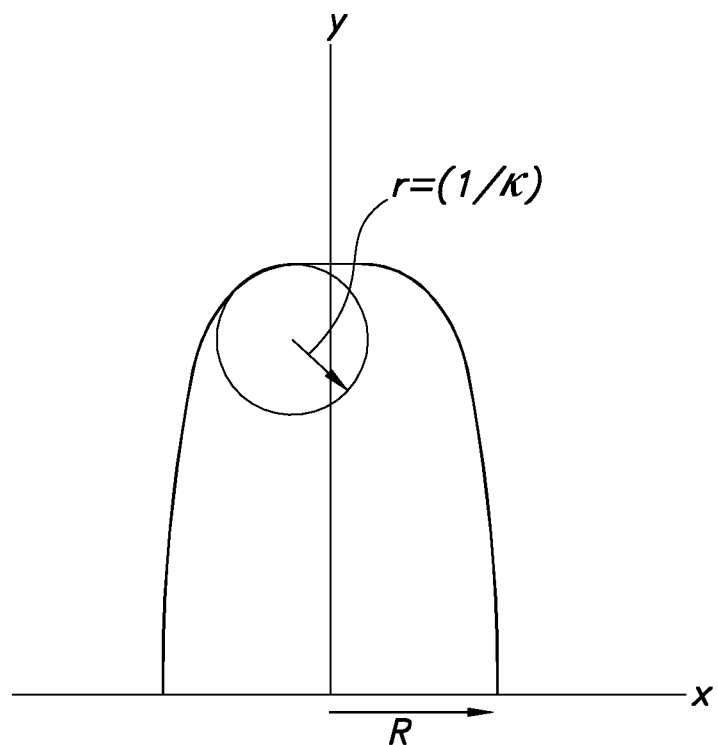

FIG. 1l shows that the local curvatures can in principle be calculated for any arbitrary structure by making cross sections such as in FIG. 1d but also in FIG. 1g. For at least 20%, especially at least 30%, of the surface area of the convex curved part 11, these values obtained should be within the range: 0.2<κR<5.

FIGS. 2a-2i schematically depicts some embodiments with indentations in the light collector device, with a first opening 1551 at the light receiving side 1010, and with a tapering of the indentation towards the light exit side 102. The distance between adjacent funnels 1052, as heart to heart distance is indicated with reference d1. The indentations in FIGS. 2a-2f can also be indicated as funnels or syphons (syphon shaped curved element); those in 1g can also be indicated as funnels or syphons (syphon shaped curved element) closed at the taper end.

A length l and width w of the light collector device 100 (as for instance indicated in FIGS. 1c, 2a-2i, and 3a-3c) may for instance both be in the range of 2 cm-20 m; especially the light collector device area, defined by l*w is in the range of 4 cm²-50 m², such as 0.01-20 m². Larger units may be provided as single units, or as arrangement or assembly of smaller (sub)units.

Figure 2A:
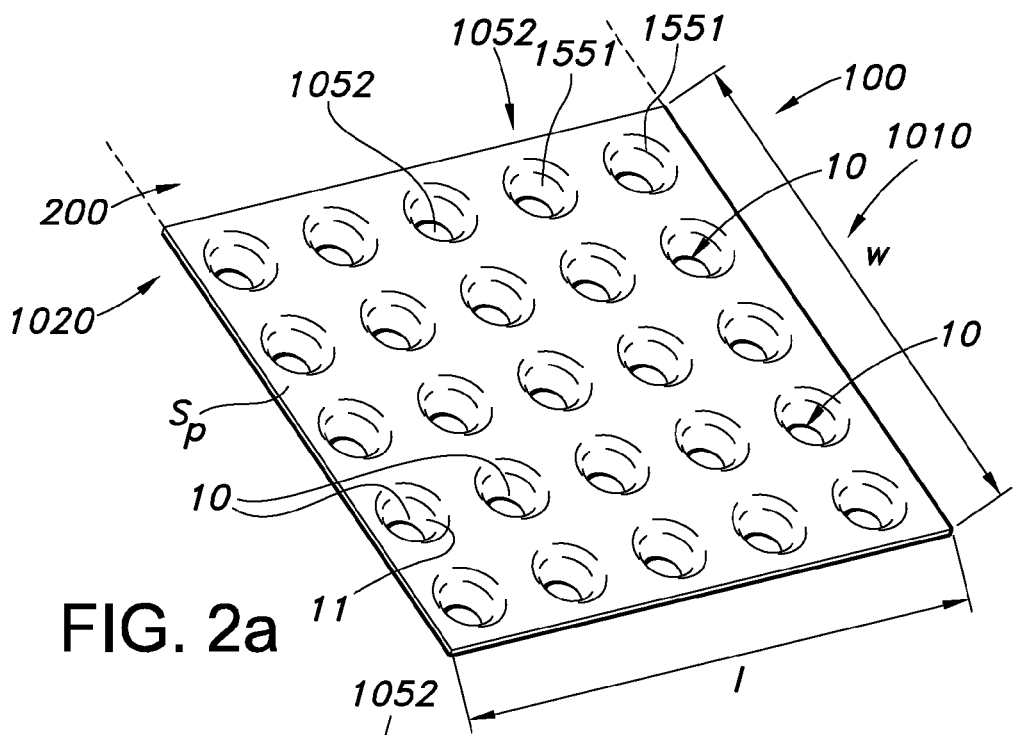
FIGS. 2a-2l schematically depict some embodiments.
Figure 2B:
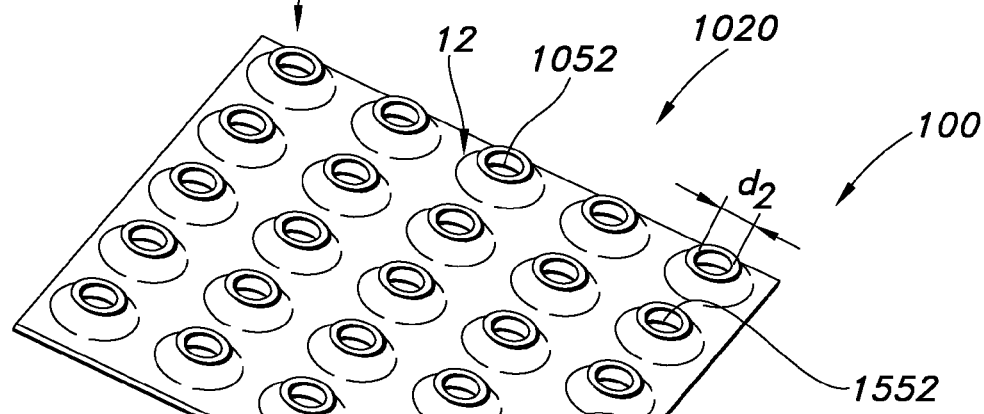
Figure 2C:
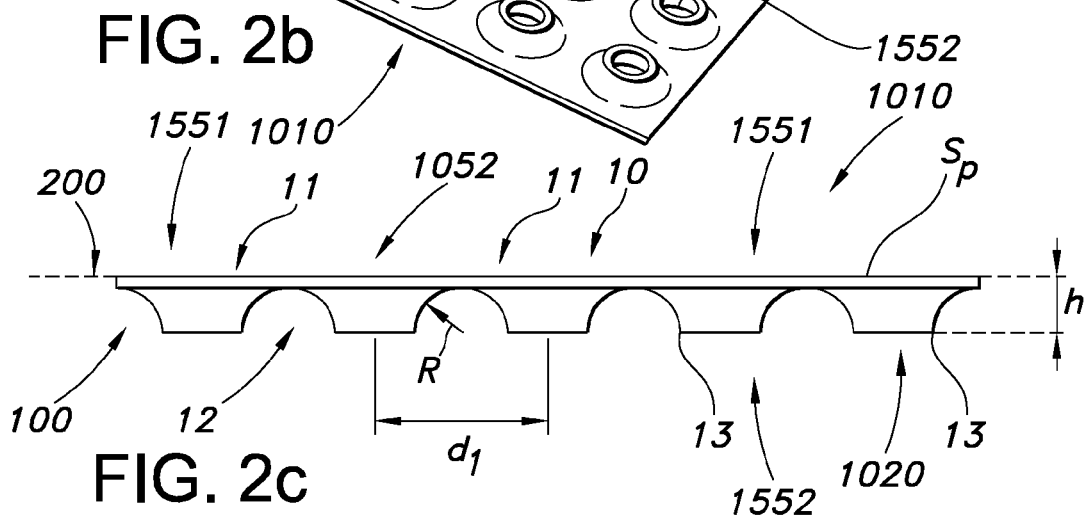

In FIGS. 2a-2c, the indentations are funnels, which are indicated with reference 1052. In FIG. 2a, the light collector device 100 is seen at the light receiving side 1010, in FIG. 2b the light collector device 100 is seen at the light exit side 1020, and in FIG. 2c a cross-sectional view of the light collector device 100 of FIGS. 2a-2b is schematically depicted. The funnels 1052 are arranged in a (non-close) cubic packing.

In FIG. 2c, the height of the light collector device 100 is indicated with reference h. Especially, the height including the curved structures (but excluding optional other layers) of the light collector device is in the order of 1 mm-100 mm, such as 2-50 mm. These heights also apply to other type of devices, like tapered end closed funnels based or sphere cap based light collector devices 100. In case of a curved structure not being a spherical cup, such as the funnels of FIGS. 2a-2c, etc., the radius of the curvature may be used as R. The surface area can be integrated over the convex curved part 11, and R can be estimated as average value for each cross-section of the convex curved part 11.

Figure 2D:
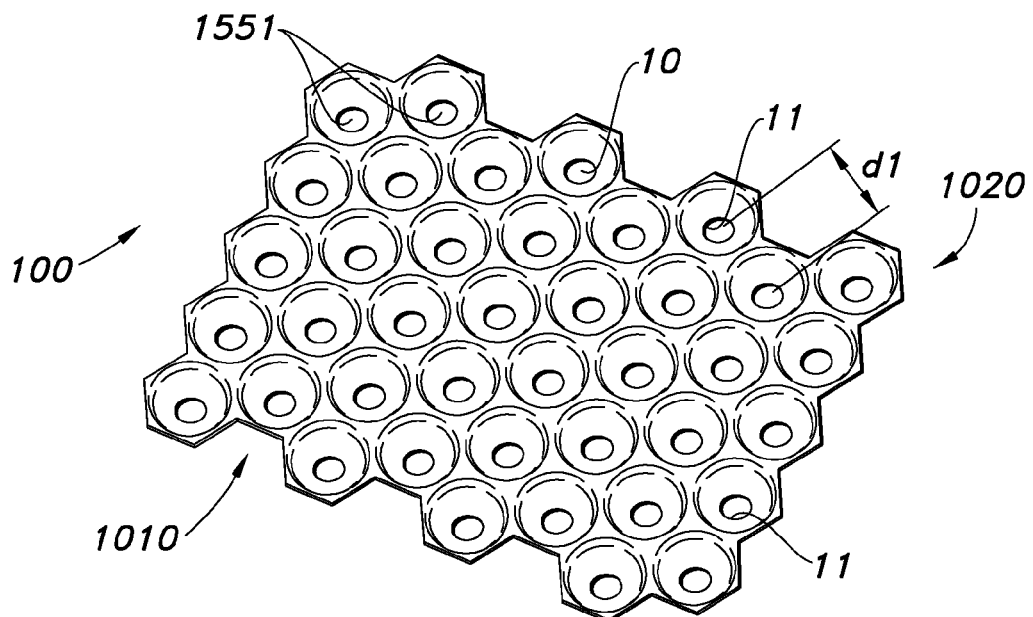
Figure 2E:
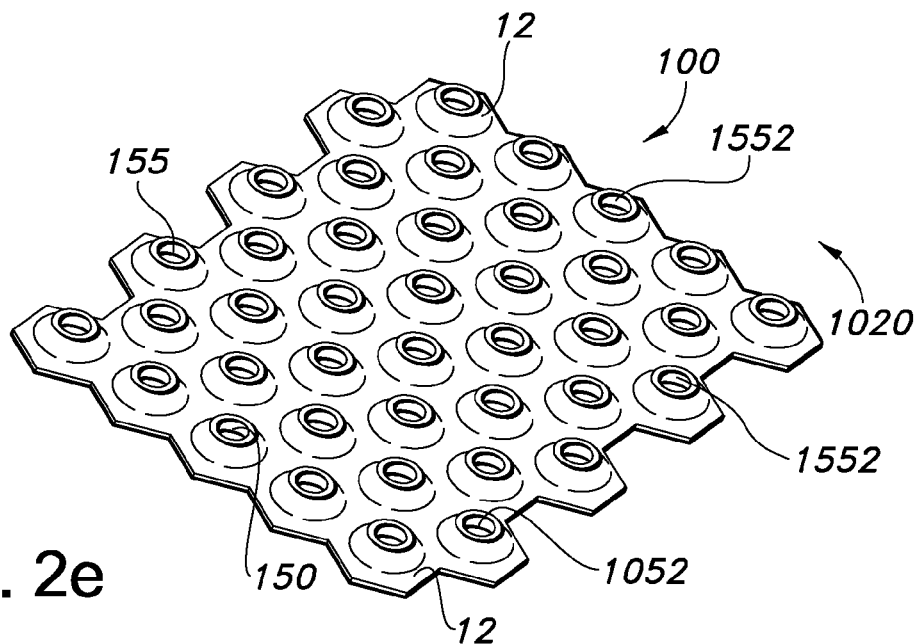
Figure 2F:
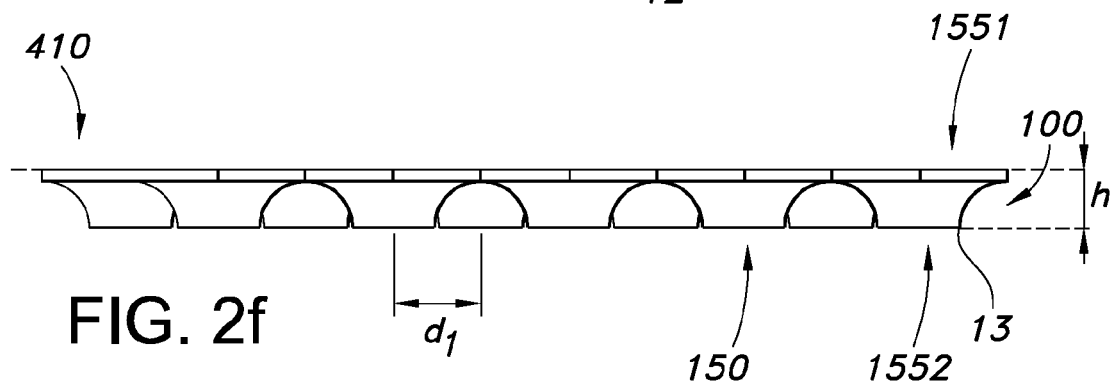

FIGS. 2d-2e schematically depict similar embodiments as schematically depicted in FIGS. 2a-2c; however, the funnels 1052 are now arranged in a close hexagonal packing.

FIGS. 2d-2e schematically depict similar embodiments as schematically depicted in FIGS. 2a-2c; however now funnels are depicted which are closed at the tapered end. Here, the curved structures 10 have the shape of 2D curved indentations, with larger first openings 1551 at the light receiving side 1010 and a closed extending end 1553 comprising the light exit edge part 13 at the light exit side 1020. These funnels are indicated as tapered end closed funnels 1053. Further, the (at the tapered end closed) funnels 1053 are arranged in a (non-close) cubic packing.

Figure 2G:
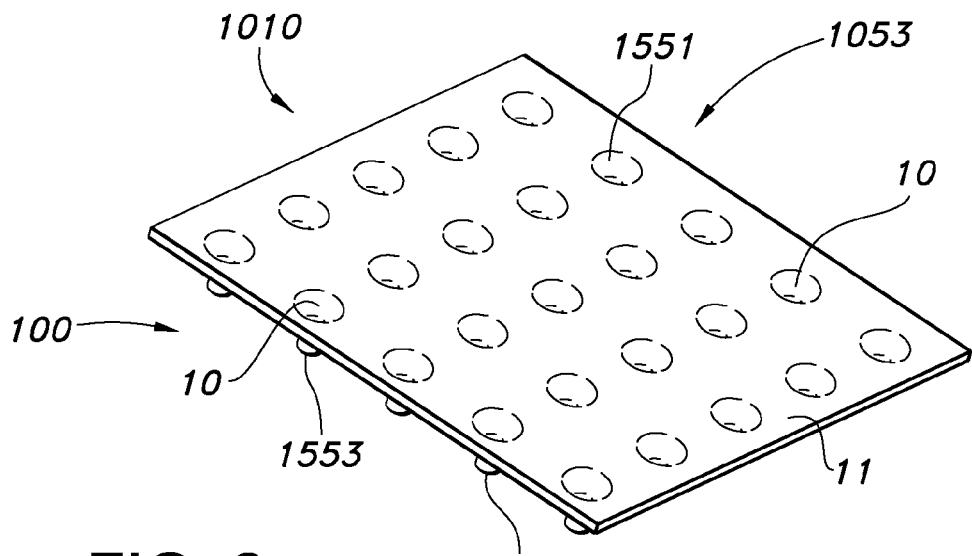
Figure 2H:
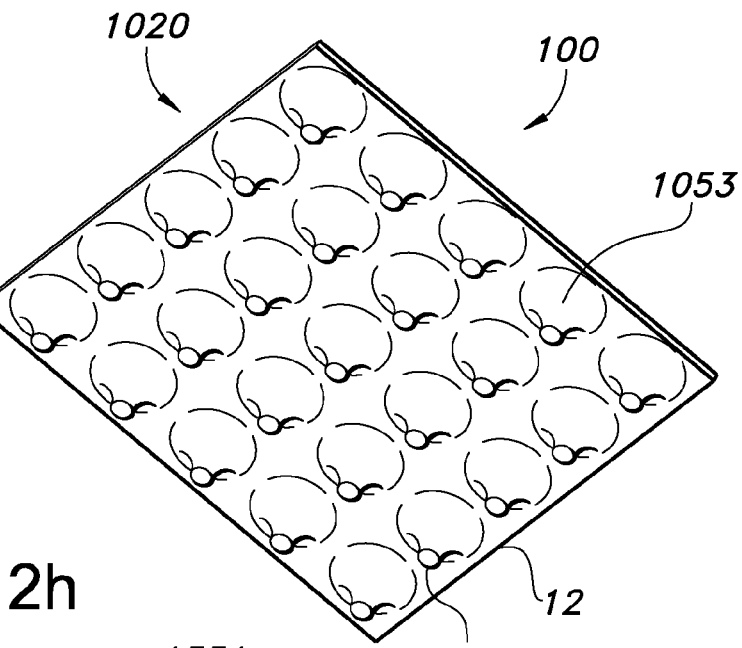
Figure 2I:
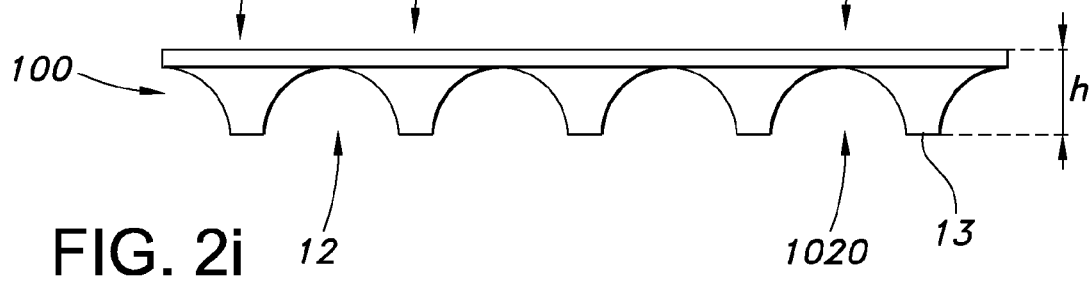
Figure 2J:
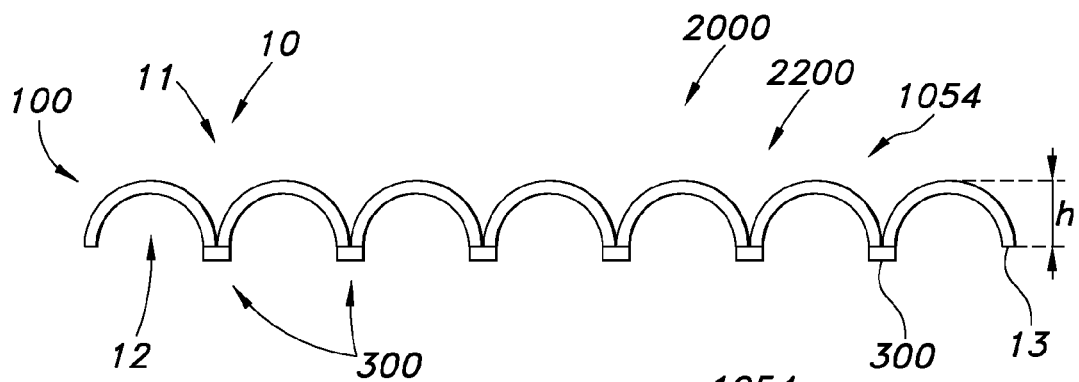
Figure 2K:
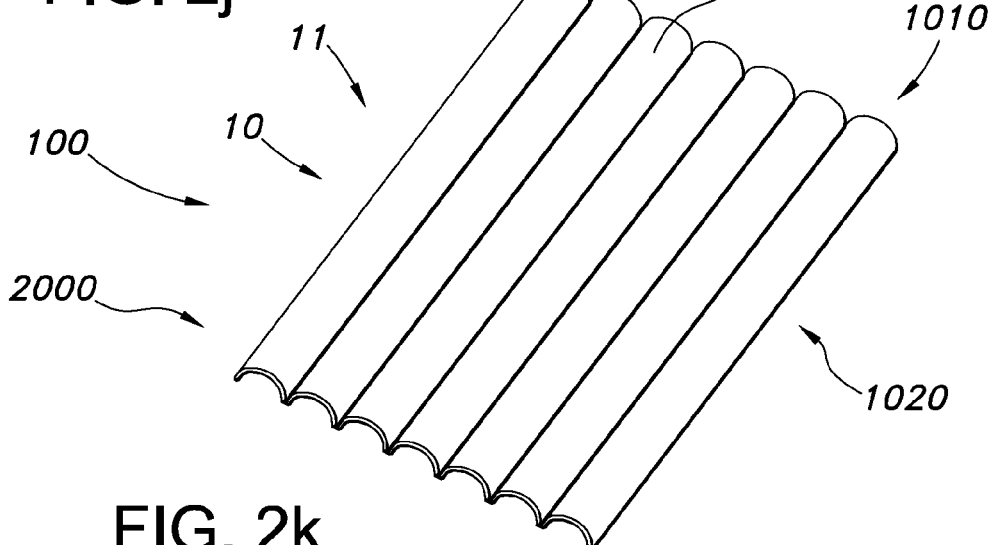
Figure 2L:
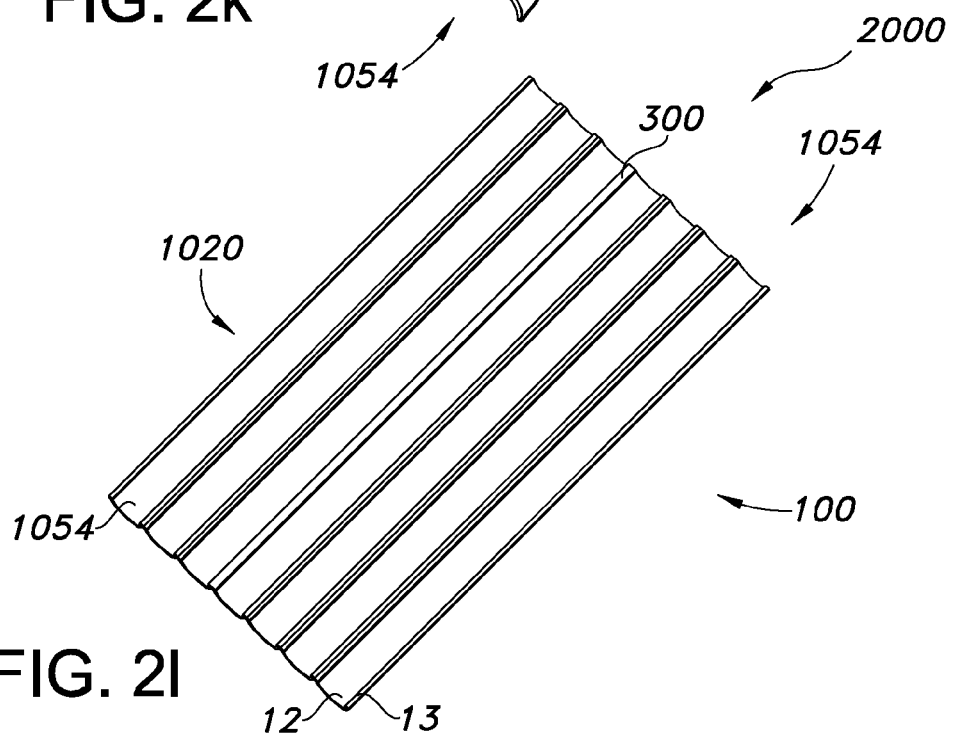

FIGS. 2j-2l schematically depict curved structures 10 having the shape of convex gutters 1054, with convex parts 11 at the light receiving side 1010 and concave parts 12 exit side

1020. Here, the curved structures 10 are configured in physical contact with adjacent curved structures 10. In FIG. 2j, the light collector device 100 is seen in cross-sectional view, in FIG. 2k the light collector device 100 is seen at the light at the light receiving side 1010, and in FIG. 2l, the light collector device is seen at the light exit side 1020 of the light collector device 100 (i.e. "from the bottom").

By way of example, FIGS. 2j-2l schematically depict an application 2000, here a solar device 2200, which further comprises solar cells 300, which are configured to receive light escaping from the light exit edge parts 13. The solar cells 300 may thus be radiationally coupled to the light exit edge parts 13. However, these convex gutters might instead of the solar cells 300 also be connected to a transparent bottom plate, for instance for other applications than solar light concentration.

Herein, the term "radiationally coupled" especially means that the light exit edge part and another part(s), such as here the solar cell(s), are associated with each other so that at least part of the radiation emitted by the light exit edge part(s) of the light collector device is received by other part(s).

Figure 3A:
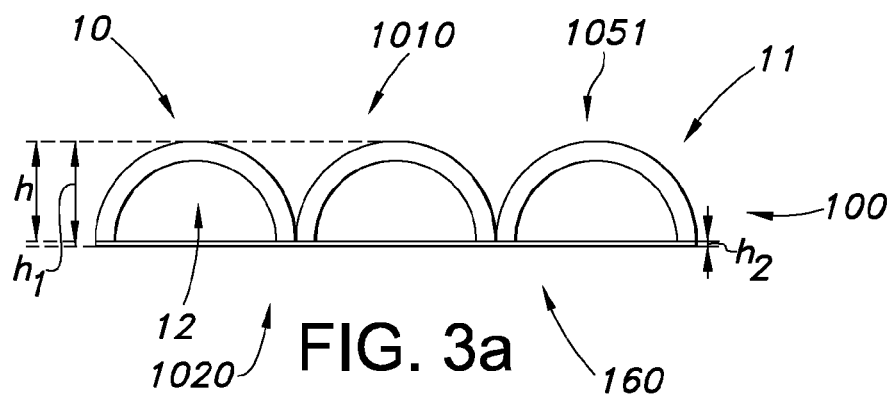
FIGS. 3a-3c schematically further depicts some aspects of the invention.
Figure 3B:
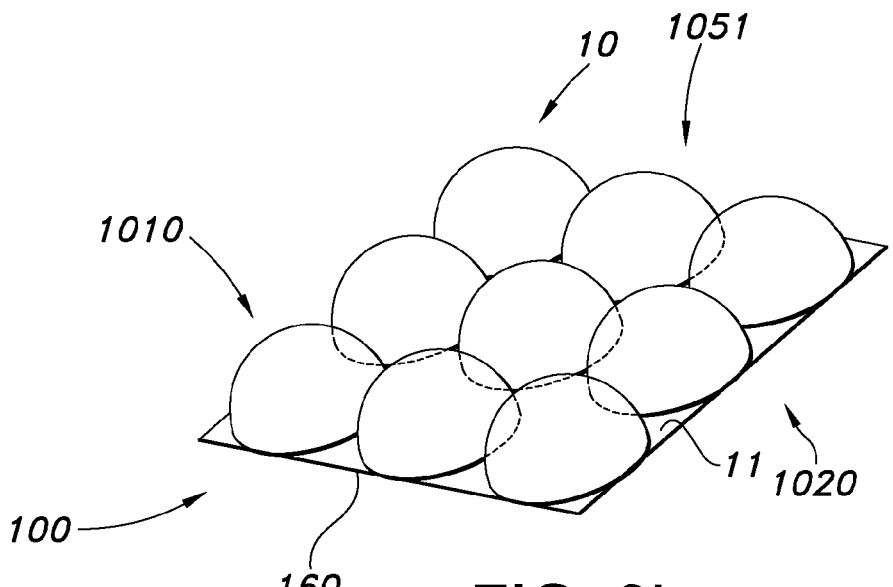
Figure 3C:
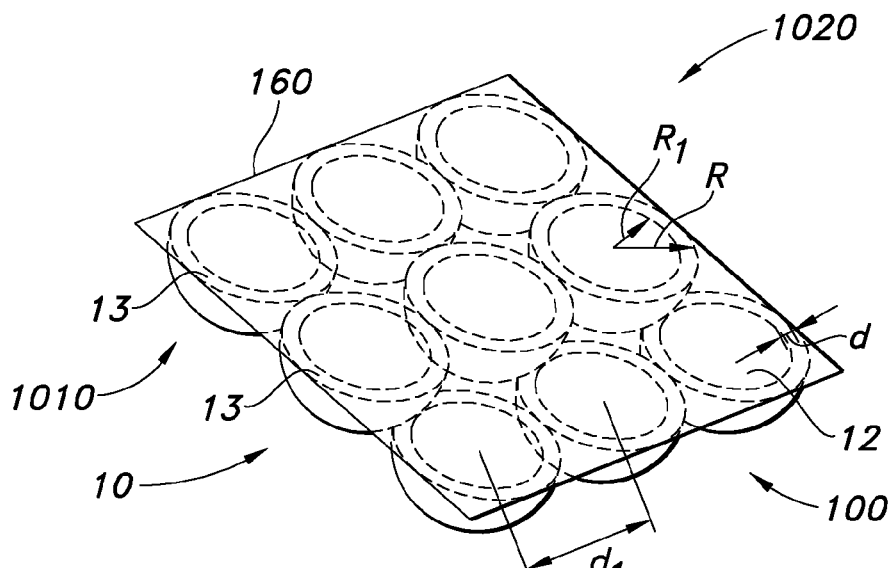

FIGS. 3a-3c schematically depict an embodiment of the light collector device 100, wherein the curved structures 10 have the shape of hollow sphere caps, indicated with reference 1051, with convex curved parts 11 at the light receiving side 1010 and concave parts 1020 at the light exit side 1020. In FIG. 3a, the light collector device 100 is seen in cross-sectional view, in FIG. 3b the light collector device 100 is seen at the light at the light receiving side 1010, and in FIG. 3c, the light collector device is seen at the light exit side 1020 of the light collector device 100 (i.e. "from the bottom").

In this embodiment, the curved structures 10 are arranged on a bottom plate 160, which has a height h2; the total height of the light collector device 100 including bottom plate 160 is indicated with reference h1. Especially h2<<h and h2<<h1, such as h/h2>5, such as >10 or h1/h2>5, such as >10.

The bottom plate 160 is transparent for at least part of the visible light and optionally also at least part of the IR light. Especially, the bottom plate has a light transmission in the range of 50-100%, especially in the range of 70-100%, for light generated by the light source, such as solar light, and having a wavelength selected from the visible wavelength range. In this way, the support cover is transmissive for visible light of the light source.

The transmission or light permeability can be determined by providing light at a specific wavelength with a first intensity to the material and relating the intensity of the light at that wavelength measured after transmission through the material, to the first intensity of the light provided at that specific wavelength to the material (see also E-208 and E-406 of the CRC Handbook of Chemistry and Physics, 69th edition, 1088-1989).

Figure 4:
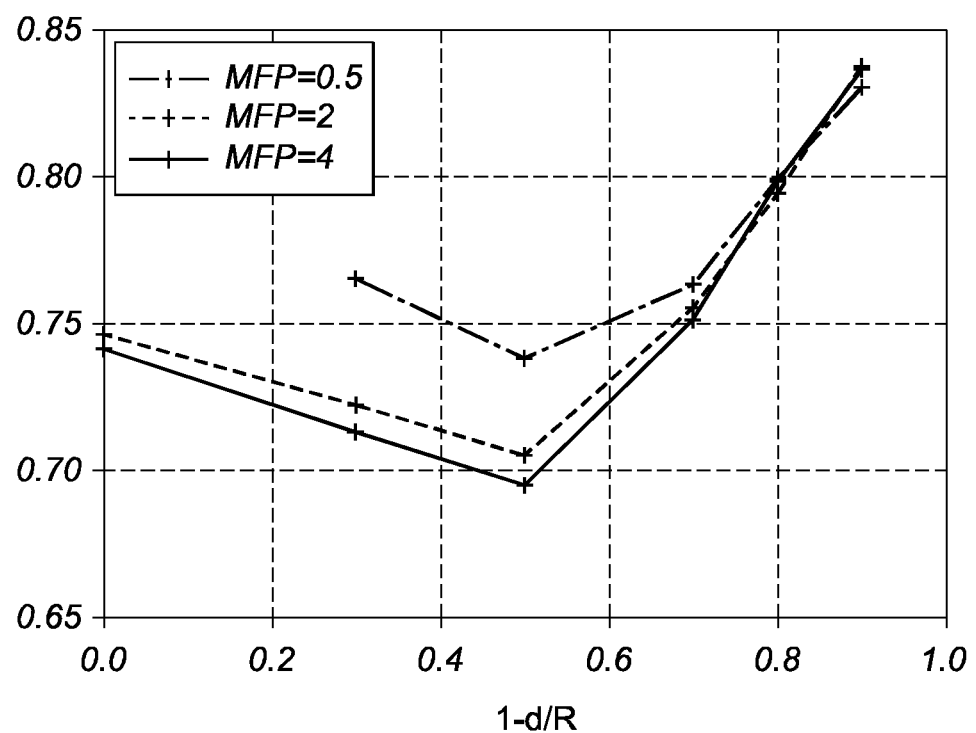
FIG. 4 depicts efficiency vs. (1−(d/R)) values plots.

In FIG. 4 the down/total flux ratio is calculated for an array of cups illuminated by a diffuse excitation source by ray tracing (LightTools 7.1.0). The edges are modelled as rough surfaces (100% forward scattering) to enhance light output. Values for the down/total flux ratio in case of thin walls of the hemispherical cups are found to be close to the estimated values (equation 5; see above). Calculations were carried out using different mean free path (MFP) values of the luminescent dyes. These MFP values reflect the concentration of the luminescent molecules dissolved in the polymer. Especially for low dye concentrations, thin-walled hemispheres are suitable for obtaining a high down/total flux ratio. Here, the values of R and d are first normalized to the value of R. For the curved structures herein, d<R. On the x-axis (1−(d/R)) is depicted. As indicated above, 0.001<d/R<0.25; therefore 0.75<1−(d/R)<1.

FIGS. 5a-5h schematically depict a number of applications 2000.

Figure 5A:
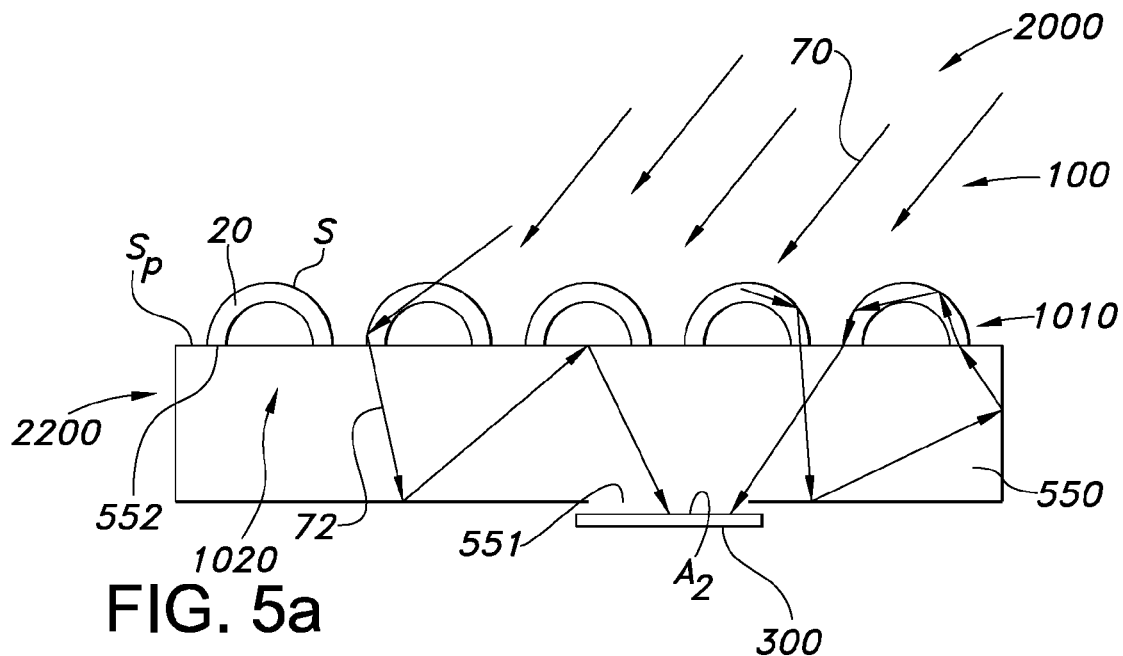
FIGS. 5a-5h schematically depict some applications of the light collector device as described herein.
Figure 5B:
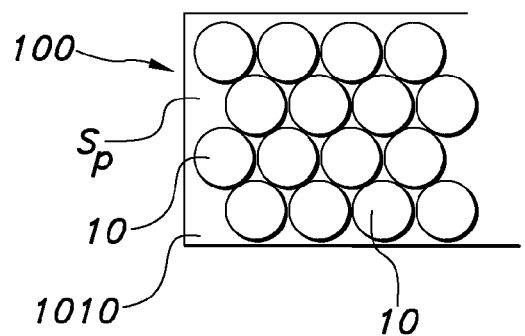

FIG. 5a schematically depicts an embodiment of a solar device 2200 comprising an embodiment of the light collector device 100 as described herein and a solar cell 300. The solar cell 300 is configured to receive light escaping from the light exit edge part(s) 13. As indicated above, the solar cell 300 is especially radiationally coupled to the light exit edge part(s). This is achieved in this embodiment, by collecting the light 72 escaping from the light exit parts 13 in a (light collection or light mixing) chamber 550 with reflective walls, and an opening 551 therein for allowing light escaping from the chamber 550 and irradiating the solar cell 300. FIG. 5b schematically depicts an top view of an embodiment of the light collector device 100 that can be used for this application 2000 (solar device 2200).

Figure 5C:
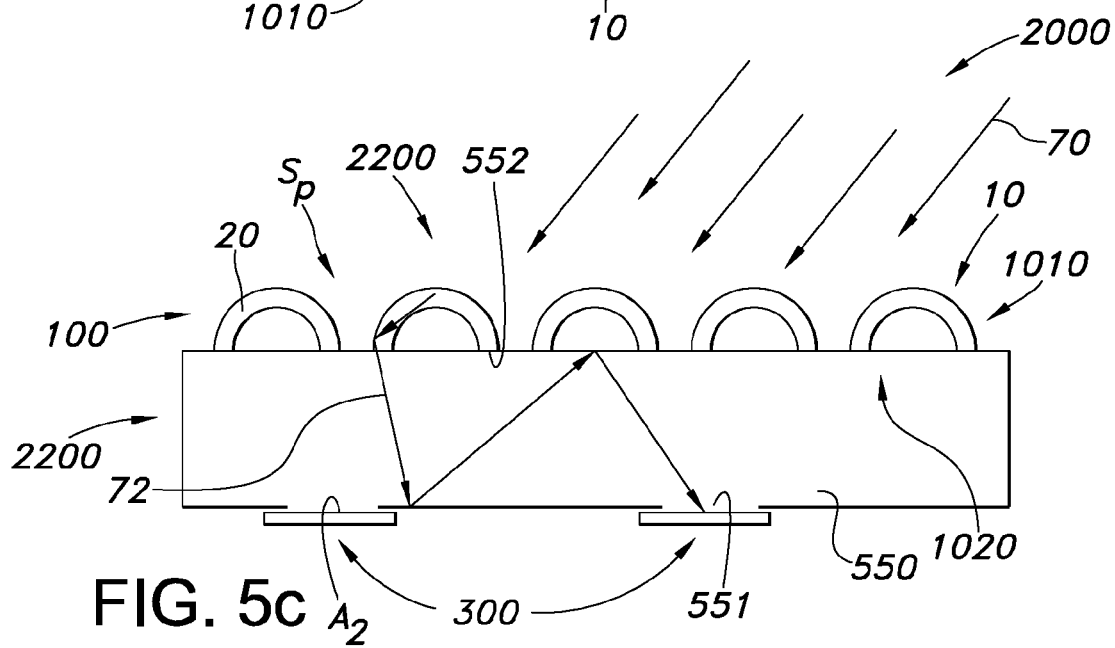

FIG. 5c schematically depicts a variant, with a plurality of openings 551, with behind each opening 551 solar cells 300, to collect substantially all the light in the chamber 550.

Hence, in an embodiment, an array of hollow, luminescent cups (such as hemispheres) is placed on the top part of a light box (chamber 500). The edges of the cups are exactly connected to openings 552 in the light box (however, also an arrangement of cups or other types of sphere caps may be applied which are arranged on a transmissive bottom plate 160; not depicted in this drawing, but see e.g. FIG. 3a). The light box also contains one or more larger exit areas on the opposite side. The inner surface of the light box is highly reflective (R>95%) and may consist of a specular or whited-iffuse reflective material (MIRO silver, MCPET, white paint). The cups preferably have thin walls to ensure effective light guiding of the luminescent light.

At the exit surface(s), solar cell(s) can be placed to receive the converted light. The cups can be arranged in various ways; a hexagonal placement creates the highest density and yields the most efficient collector. The top area (receiving the solar light) is in general much larger than the area for the solar cells ($\Sigma A2$) ($\Sigma S/\Sigma A2 >> 10$). The concentration process starts at the luminescent cups where solar light is effectively converted into light of higher wavelengths. The luminescent light which experience TIR at the large surfaces of the cups is transported towards the edges and injected into the light box. Multiple reflections inside the light box eventually transports the light to the solar cells at the exit surfaces. Because of the multiple reflections, a high reflectivity of the light box surface is preferred to retain a high optical efficiency. Another aspect is that all light injected in the lightbox is essentially "trapped" in the light box until it hits the solar cell. However, there is also a possibility that the light present in the light box hits the edges of the luminescent cups. In that case, light is simply transported through the cup back into the light box.

The big advantage of separated cups is the limited optical path length of the photons emitted in the excitation process (i.e. light is collected in the most efficient way). Typical (practical) sizes of the cups are in the range of 10-20 mm (outer diameter R). The wall light guide thickness is in the range of 0.5-2 mm. Small cups are preferred because of the low optical path involved. These dimension may also apply to other embodiments depicted and/or described herein.

Optionally, different curved structures 10 may comprise different types of dyes, as is by way of example in FIG. 5e (see below) indicated with the different shadings of the curved structures 10.

Figure 5D:
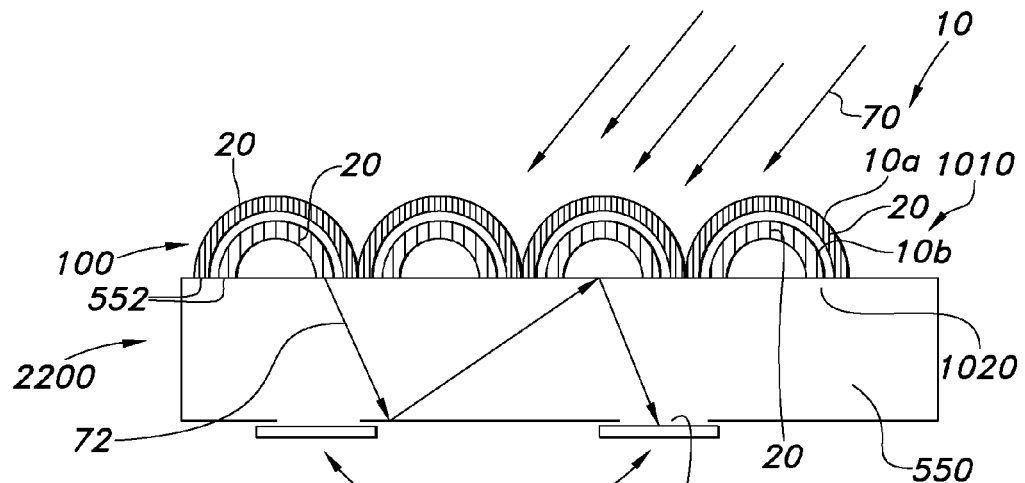

FIG. 5d schematically depicts an embodiment of the light collector device 100 comprising first curved structures 10a and second curved structures 10b. The first curved structures 10a enclose the second curved structures 10b. Especially, the dye in the waveguide material 20 of the first curved structures 10a differs from the dye in the waveguide material 20 of the second curved structures 10b. note that this specific curved structures arrangement is not only limited to solar cell applications, as depicted in this drawing.

Hence, in for instance FIGS. 5c-5d (and also 5e, see below), the light converting cups, or other types of sphere caps, may contain different dye types. This separation may yield a higher overall efficiency because there is (almost) no interference between the various dyes (i.e. light emitted by one dye type cannot be absorbed by the other dye). The advantage of the light box concept is that all converted/luminescent light is well mixed and illuminates the solar cell in a uniform way.

Figure 5E:
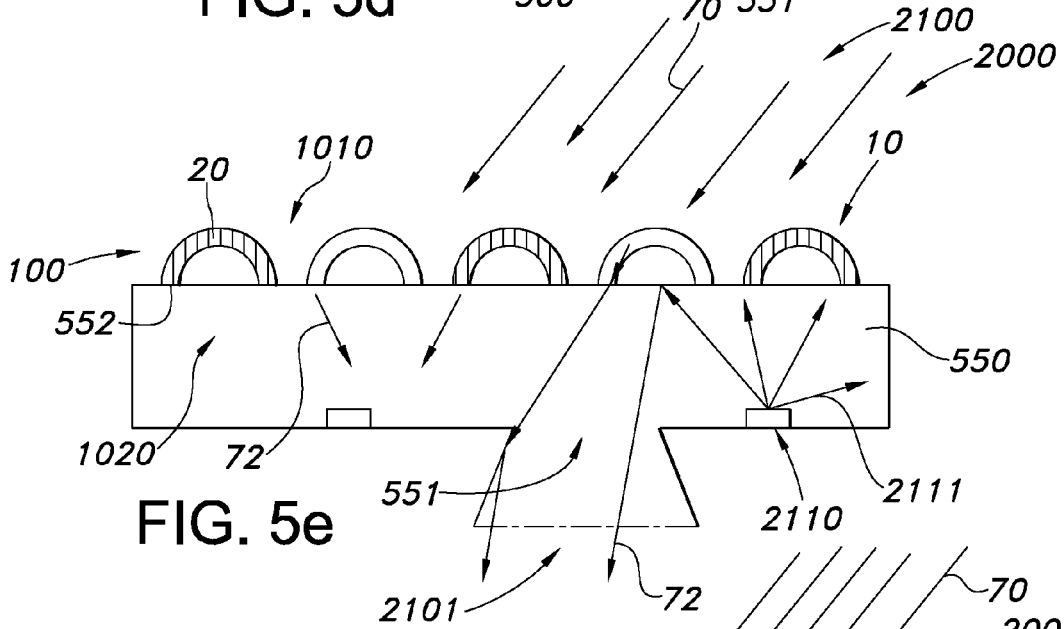
Figure 5F:
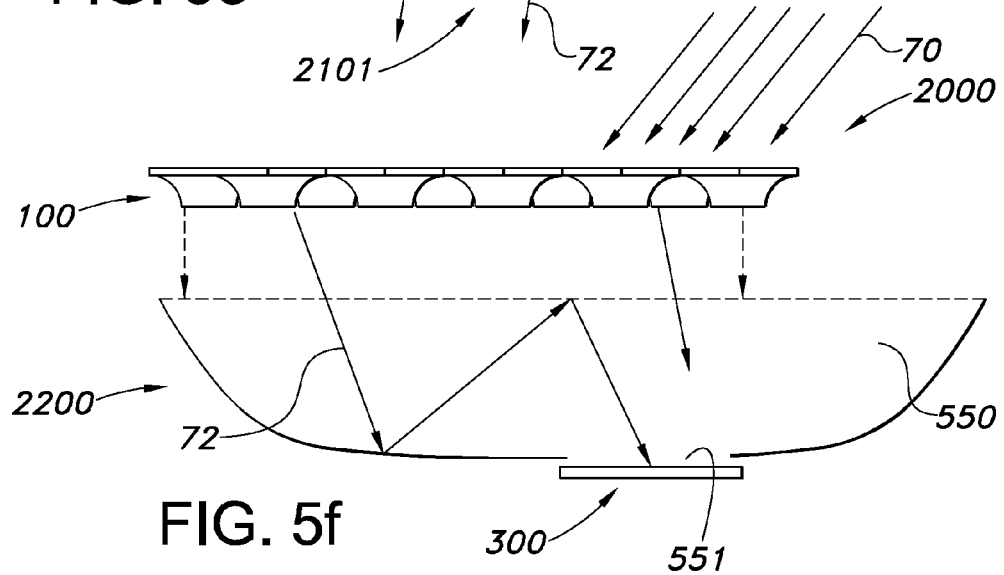

FIG. 5e schematically depicts an embodiment wherein the light collector device 100 is used in a lighting unit 2100. Here, the opening 551 in the chamber 500 is used to provide light lighting unit light 2101. Optionally, additional light sources 2110 may be applied, for instance to further complement the spectrum.

The light source can be any light source, but is (thus) especially a light source that is able to substantially emit in the UV or in the blue. Hence, in an embodiment the light source comprises a blue emitting light emitting device. In yet another embodiment, which may be combined with the former embodiment, the light source comprises a UV emitting light emitting device. Hence, the term light source may in especially relate to a LED (light emitting diode). Preferably, the light source is a light source that during operation emits at least light at wavelength selected from the range of 300-480 nm, especially 380-460. This light may partially be used by the light conversion element (see below). In a specific embodiment, the light source comprises a solid state LED light source (such as a LED or laser diode). The term "light source" may also relate to a plurality of light sources, such as 2-20 (solid state) LED light sources. Optionally, the light source is configured to generate white light (and optionally UV light) (see also below), and part of the blue and/or optional UV light is used by one or more of the luminescent materials as excitation light and at least partially converted into luminescence.

Hence, with this embodiment light collection is used to generate e.g. white light by combining luminescent light and blue LEDs. In this approach the emission spectra of the cups, containing various luminescent dyes, and the blue LEDs yield a "white spectrum". The white light can be used directly for indoor illumination in cases where a conventional skylight is not preferred. It allows you to integrate daylight and artificial light into a single compact light source. The white light can also be collimated and injected into a light tube for illumination of spaces without daylight access. Sensors and controls may be applied to keep the light level and color temperature constant. Additional white LEDs may be installed in cases where solar illumination is insufficient. The system depicted in FIG. 5e can be integrated in the roof ("roof panel") and can also be integrated in building walls. The system can also serve as an architectural or decorative element in buildings.

Optionally, two or more subsets of curved structures 10 may comprise different dyes, as indicated by the (different) shading.

FIG. 5f again schematically depicts a solar device 2200. The light collector device is used as described. Again, light escaping from the edges of the luminescent structures is injected into openings 552 in the light box which subsequently guides the light to one or more solar cells 300.

Figure 5G:
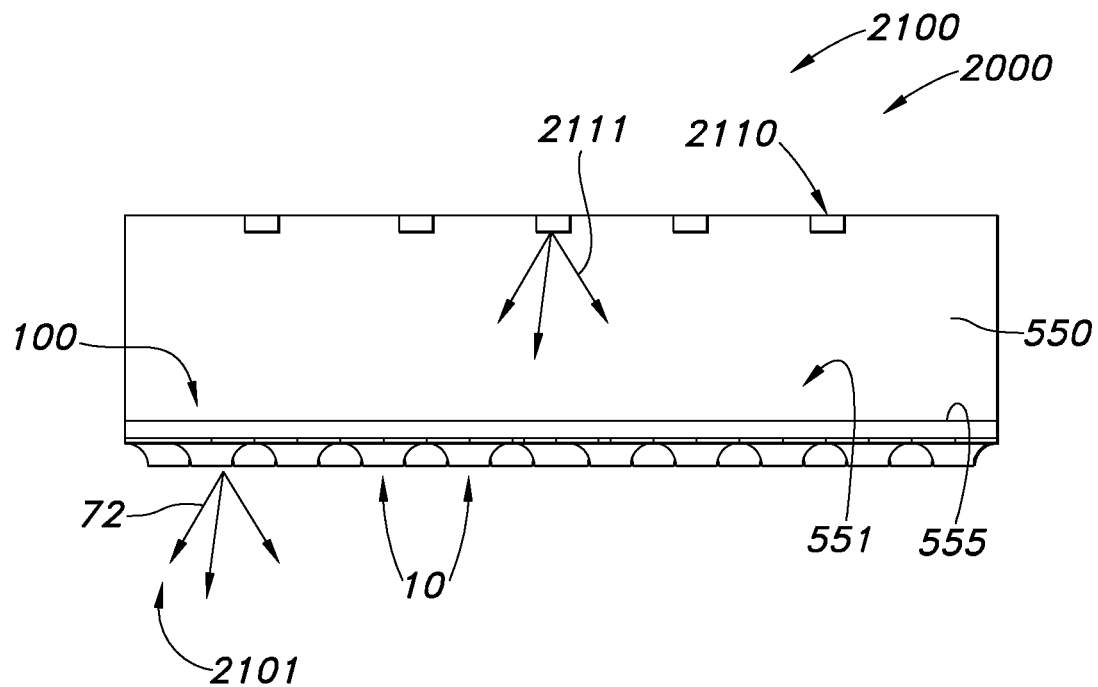

FIG. 5g schematically depicts another type of application 2000, here a lighting unit 2100. The lighting unit 2100, comprises the light collector device 100, as defined herein (here one example of the embodiments is shown by way of example), and a light source 2100, in general a plurality of light sources 2110, and optionally a diffusor plate 555. The light sources 2110 are configured to provide light source light 2111 to the light receiving side 1010. The optional diffusor plate 555 is configured between the plurality of light source 2110 and the light collector device (100). The optional diffusor plate 555 is arranged upstream of the light collector device 100. The light sources 2110 are arranged in chamber 550. Further the chamber 550 has one or more openings 551, which allow light to escape from the chamber 50 via (the optional diffusor 555 and) the light collector device 100. Light 2101 at least comprises converted light 72, but may optionally also comprise non-converted light 2111. In this embodiment, there is one large single opening 551, entirely closed by the light collector device 100, and the (optional) upstream thereof arranged diffusor 555.

Figure 5H:
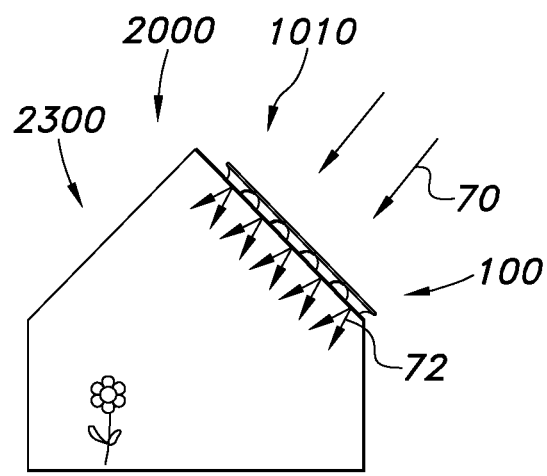

FIG. 5h schematically depicts another application 2000, here a greenhouse 2300 comprising the light collector device 100. The collector device 100 is configured to provide light via the light exit edge parts 13 into the greenhouse 2300. Of course, a plurality of light concentrators 100 may be applied. Further, above described embodiments and variants may be applied.

Hence, the invention provides light collector devices wherein the converted light is emitted mainly from one side of the sheet (>80%, even >85% of the total emitted light). The luminescent structures may consist of a 3D shaped, clear film in which luminescent dyes are incorporated. The invention may be relevant for a new generation of luminescent solar collectors and as a light conversion component in LED based illumination systems.

Therefore, it is an aspect of this invention to use in particular the "edge light" to generate an optical sheet component, emitting light for a large part in only one ("forward") direction. This is achieved by creating a family of structures as depicted in the accompanying drawings. Light from an excitation source (sun, blue LEDs, etc.) is "collected" at the smooth side. The emitted light in the luminescent structure is transported through the curved profile towards the exit surface. For effective guiding of the luminescent light, the walls of the structure should be thin. Especially, d<0.5R and for even better performance d<0.25R may be preferred. For ideal 3D structures, about 86% of the released luminescent light escapes at the exits.

In some embodiments, holes (indentations) in the structure have an hexagonal arrangement. This arrangement may ensure a minimal optical path of the light emitted in the material. The minimal optical path is advantageous for achieving a high efficiency because scatter/absorption losses are minimized (scatter losses may occur at surface imperfections). The curved shape of the component improves the incoupling of light from the excitation source dramatically, as compared with a flat plate (especially at high angles of incidence). A plurality of alternatives configurations may be chosen:

The holes in the structure can also have a square arrangement (see FIG. 1c).

The holes can have a very small or zero surface area (at the bottom; see FIGS. 2g-2i).

The holes can have an elongation (FIGS. 1h-1j). This elongation can have a tapered structure (FIG. 1i)

The holes can have a roughened exit surface (to avoid light trapping and thereby increasing the efficiency).

The exit plane can be tilted.

The exit plane can be connected to a collimating optical element (FIG. 1j).

The complete or part of the structure may be provided with an anti-reflective coating.

The light guiding material, especially the polymeric light guiding material, may contain multiple dyes (luminescent or a combination of luminescent and absorbing dyes).

The light guiding material, especially the polymeric light guiding material, may be coated with an optical multi-layered interference filter to reflect or transmit specific parts of the (visible) spectrum.

The invention may primarily be used for collecting, especially concentrating, solar energy and generating electricity using a solar cells. The solar collector can be applied "in the open field" but can also be integrated in luminaires for road lighting (combined with solar cells and energy storage). The invention can also be used for indoor illumination in cases where a conventional skylight is not preferred. It allows you integrate "converted daylight" and artificial (blue) light into a single compact light source. The system can also be used as an architectural/decorative lighting element in e.g. the wall of a building.

The invention claimed is:

1. A sheet-like light collector device comprising a light receiving side and a light exit side, the light collector device comprising a plurality of curved structures of light guiding material, wherein the light guiding material comprises an organic light conversion dye for absorption of at least part of light of a light source and for conversion of at least part of the absorbed light into converted light in the visible and IR wavelength range, wherein each curved structure has a convex curved part at the light receiving side, for receiving light from said light source and for coupling light source light into the curved structure, a concave part at the light exit side, and a light exit edge part at the light exit side, wherein each curved structure has a curvature and a light guide thickness for facilitating transport of the incoupled light and the converted light in the direction of the light exit edge part to provide device light escaping from the light exit edge part.

2. The light collector device according to claim 1, wherein at least 20% of the surface area of the convex curved parts have a local curvature $0.2 < \kappa R < 5$ wherein $\kappa$ is the local curvature of a fitting circle in a cross-sectional plane of the convex curved part describing the local curvature, and wherein R is the radius of a ground plane.

3. The light collector device according claim 2, wherein each curved structure has a ground plane radius, wherein the curved structure has the shape of a sphere cap, wherein the convex curved part having said ground plane radius (R) has a curved structure surface area, wherein the curvature of the convex curved part has a normalized area in the range $2.5 \leq S/R^2 \leq 30$, and has a light guide thickness which is selected from the range of 0.5-50 mm.

4. The light collector device according to claim 2, wherein the ratio of the light guide thickness and ground plane radius (d/R) is $0.001 \leq d/R \leq 0.25$.

5. The light collector device according claim 2, having a ground plane radius selected from the range of 0.25-100 mm, and wherein the convex curved part having said ground plane radius has a curved structure surface area in the range of 10 mm2-0.3 m2.

6. The light collector device according to claim 1, wherein the curved structures have the shape of segments of 2D curved funnels, with larger first openings at the light receiving side and smaller second openings at the light exit side.

7. The light collector device according to claim 1, wherein the curved structures have the shape of segments of 2D curved indentations, with larger first openings at the light receiving side and a closed extending end comprising the light exit edge part at the light exit side.

8. The light collector device according to claim 1, wherein the curved structures have the shape of segments of hollow sphere caps, with convex curved parts at the light receiving side and concave parts at the light exit side.

9. The light collector device according to claim 6, comprising a hexagonal close packing or cubic close packing of similar curved structures.

10. The light collector device according to claim 1, wherein the curved structures have the shape of segments of convex gutters, with convex parts at the light receiving side and concave parts at the exit side.

11. The light collector device according to claim 1, wherein two or more subsets of the total number of curved structures comprise two or more dyes, respectively.

12. The light collector device according to claim 1, comprising first curved structures and second curved structures, the first curved structures enclosing the second curved structures, wherein the dye in the waveguide material of the first curved structures differs from the dye in the waveguide material of the second curved structures.

13. A solar device comprising the light collector device according to claim 1 and a solar cell, wherein the solar cell is configured to receive light escaping from the light exit edge part.

14. A greenhouse comprising the light collector device according to claim 1, wherein the collector device is configured to provide light via the light exit edge parts into the greenhouse.

15. A lighting unit, comprising the light collector device according to claim 1, a plurality of light sources, and optionally a diffuser plate, wherein the light sources are configured to provide light source light to the light receiving side, and wherein the optional diffuser plate is configured between the plurality of light source and the light collector device.

* * * * *